United States Patent
Lu et al.

(10) Patent No.: US 11,699,502 B2
(45) Date of Patent: Jul. 11, 2023

(54) SIMULATING MEMORY CELL SENSING FOR TESTING SENSING CIRCUITRY

(71) Applicant: SanDisk Technologies LLC, Addison, TX (US)

(72) Inventors: Iris Lu, Fremont, CA (US); Yan Li, Milpitas, CA (US); Ohwon Kwon, Pleasanton, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/550,352

(22) Filed: Dec. 14, 2021

(65) Prior Publication Data
US 2023/0187014 A1    Jun. 15, 2023

(51) Int. Cl.
*G01R 31/3181*      (2006.01)
*G11C 29/16*      (2006.01)
(Continued)

(52) U.S. Cl.
CPC .......... *G11C 29/54* (2013.01); *G01R 31/3181* (2013.01); *G11C 7/065* (2013.01);
(Continued)

(58) Field of Classification Search
CPC ......... G11C 29/54; G11C 7/065; G11C 7/067; G11C 29/16; G01R 31/3181;
(Continued)

(56) References Cited

U.S. PATENT DOCUMENTS

| 5,369,647 A | 11/1994 | Kreifels et al. |
| 5,612,916 A | 3/1997 | Neduva |

(Continued)

FOREIGN PATENT DOCUMENTS

| CN | 103377961 A | * 10/2013 | |
| JP | 2004071119 A | * 3/2004 | ............. G11C 29/02 |

OTHER PUBLICATIONS

Weber, Charles, "A Standardized Method for CMOS Unit Process Development," IEEE Transactions on Semiconductor Manufacturing, vol. 5, No. 2, May 1992, 7 pages.
(Continued)

*Primary Examiner* — Jay W. Radke
(74) *Attorney, Agent, or Firm* — Vierra Magen Marcus LLP

(57) ABSTRACT

Technology is disclosed herein for testing circuitry that controls memory operations in a memory structure having non-volatile memory cells. The testing of the circuitry can be performed without the memory structure. The memory structure may reside on one semiconductor die, with sense blocks and a control circuit on another semiconductor die. The control circuit is able to perform die level control of memory operations in the memory structure. The control circuit may control the sense blocks to simulate sensing of non-volatile memory cells in the memory structure even though the sense blocks are not connected to the memory structure. The control circuit verifies correct operation of the semiconductor die based on the simulated sensing. For example, the control circuit may verify correct operation of a state machine that controls sense operations at a die level. Thus, the operation of the semiconductor die may be tested without the memory structure.

20 Claims, 16 Drawing Sheets

(51) Int. Cl.
  *G11C 7/06* (2006.01)
  *G11C 29/54* (2006.01)
  *H10B 80/00* (2023.01)
  *G01R 31/3177* (2006.01)
  *H01L 25/065* (2023.01)
  *H01L 25/18* (2023.01)

(52) U.S. Cl.
  CPC .............. *G11C 7/067* (2013.01); *G11C 29/16* (2013.01); *H10B 80/00* (2023.02); *G01R 31/3177* (2013.01); *H01L 25/065* (2013.01); *H01L 25/0652* (2013.01); *H01L 25/0655* (2013.01); *H01L 25/0657* (2013.01); *H01L 25/18* (2013.01)

(58) Field of Classification Search
  CPC ... G01R 31/3177; H10B 80/00; H01L 25/065; H01L 25/0652; H01L 25/0655; H01L 25/0657; H01L 25/18
  See application file for complete search history.

(56) References Cited

U.S. PATENT DOCUMENTS

| | | | | |
|---|---|---|---|---|
| 6,144,597 | A * | 11/2000 | Kim | G11C 29/36 714/719 |
| 7,085,184 | B1 * | 8/2006 | Walther | G11C 7/12 365/207 |
| 7,289,373 | B1 * | 10/2007 | Son | G11C 7/08 365/207 |
| 7,743,293 | B2 | 6/2010 | Avraham | |
| 2006/0198223 | A1 * | 9/2006 | Vollrath | G11C 29/02 365/207 |
| 2006/0253663 | A1 | 11/2006 | Johnson et al. | |

OTHER PUBLICATIONS

Al-Ars, Zaid, et al., "Static and Dynamic Behavior of Memory Cell Array Opens and Shorts in Embedded DRAMs," Section Computer Engineering, Faculty of Information Technology and Systems, Delft University of Technology, Dec. 2000, 8 pages.

* cited by examiner

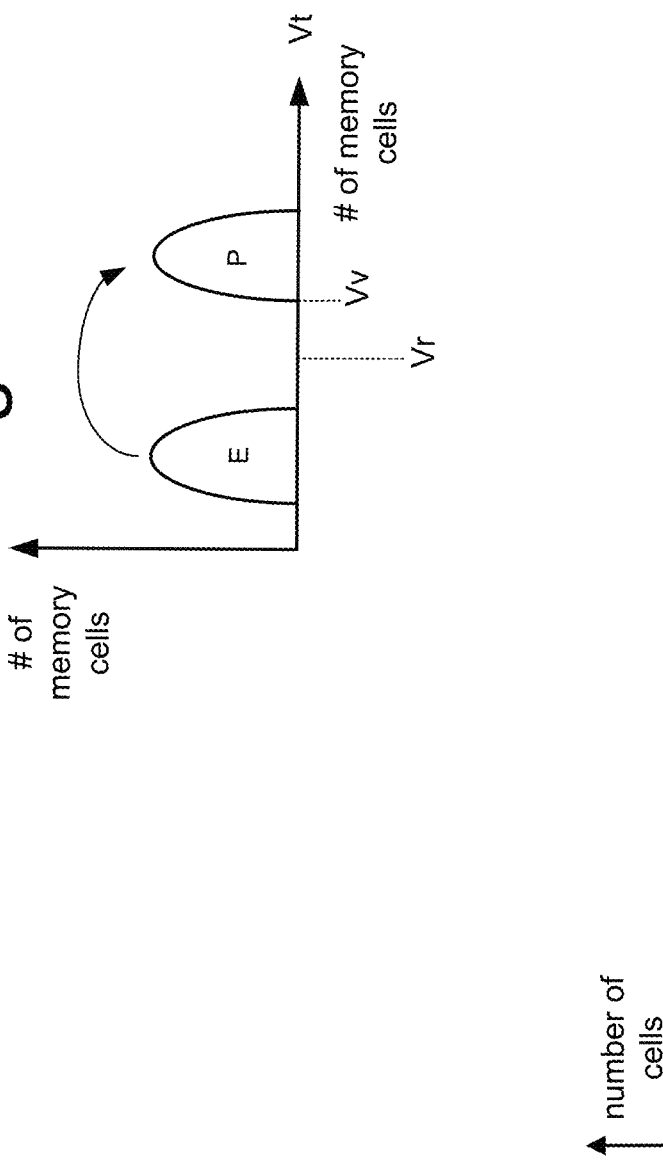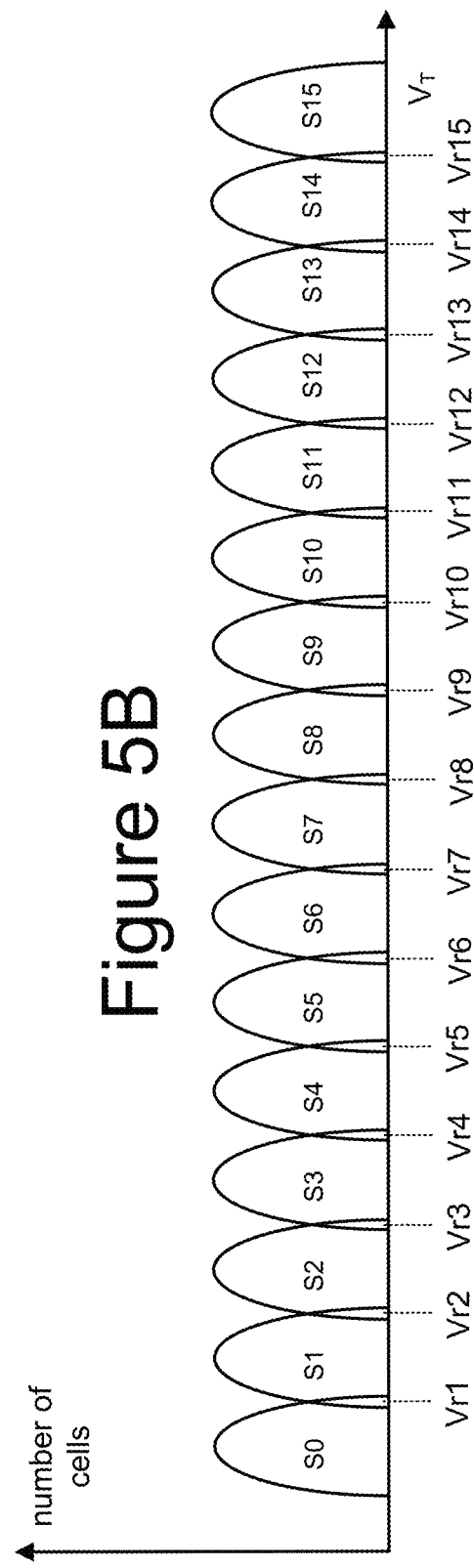

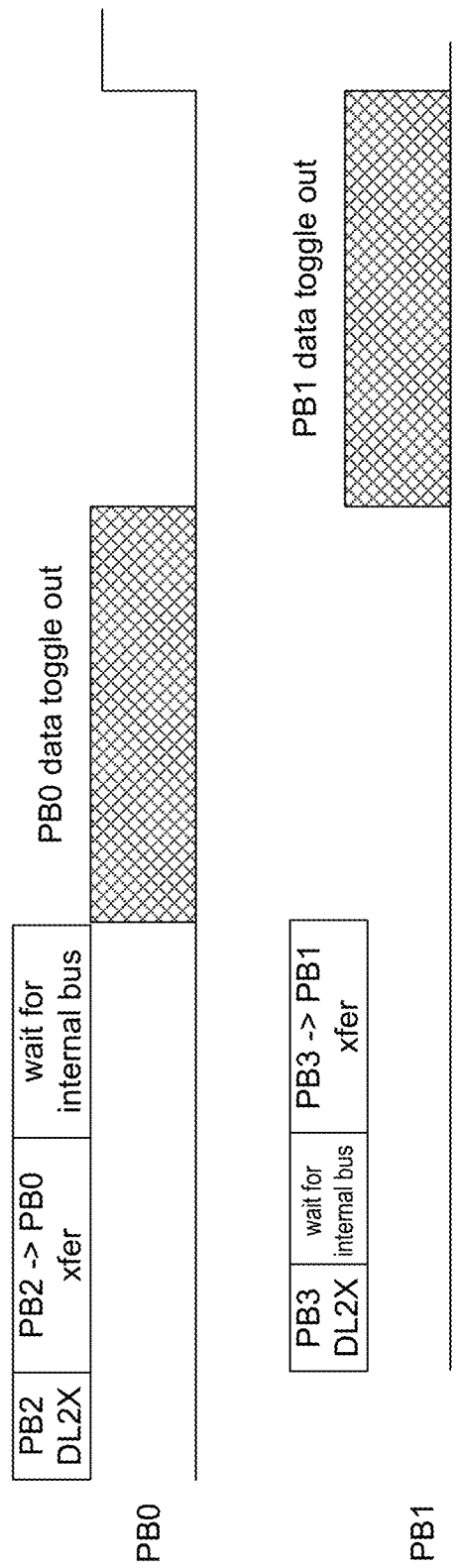

| SA | Data state | NLO | | | |
|---|---|---|---|---|---|
| | | Vr1 | Vr3 | Vr6 | Vr12 |
| 15 | S15 | OFF | OFF | OFF | OFF |
| 14 | S14 | OFF | OFF | OFF | OFF |
| 13 | S13 | OFF | OFF | OFF | OFF |
| 12 | S12 | OFF | OFF | OFF | OFF |
| 11 | S11 | OFF | OFF | OFF | ON |
| 10 | S10 | OFF | OFF | OFF | ON |
| 9 | S9 | OFF | OFF | OFF | ON |
| 8 | S8 | OFF | OFF | OFF | ON |
| 7 | S7 | OFF | OFF | OFF | ON |
| 6 | S6 | OFF | OFF | OFF | ON |
| 5 | S5 | OFF | OFF | ON | ON |
| 4 | S4 | OFF | OFF | ON | ON |
| 3 | S3 | OFF | ON | ON | ON |
| 2 | S2 | OFF | ON | ON | ON |
| 1 | S1 | OFF | ON | ON | ON |
| 0 | S0 | ON | ON | ON | ON |

Figure 15A

| SA | Data State | NLO | | | |
|---|---|---|---|---|---|
| | | Vr12 | Vr6 | Vr3 | Vr1 |
| 15 | S15 | OFF | OFF | OFF | OFF |
| 14 | S14 | OFF | OFF | OFF | OFF |
| 13 | S13 | OFF | OFF | OFF | OFF |
| 12 | S12 | OFF | OFF | OFF | OFF |
| 11 | S11 | ON | OFF | OFF | OFF |
| 10 | S10 | ON | OFF | OFF | OFF |
| 9 | S9 | ON | OFF | OFF | OFF |
| 8 | S8 | ON | OFF | OFF | OFF |
| 7 | S7 | ON | OFF | OFF | OFF |
| 6 | S6 | ON | ON | OFF | OFF |
| 5 | S5 | ON | ON | OFF | OFF |
| 4 | S4 | ON | ON | OFF | OFF |
| 3 | S3 | ON | ON | ON | OFF |
| 2 | S2 | ON | ON | ON | OFF |
| 1 | S1 | ON | ON | ON | OFF |
| 0 | S0 | ON | ON | ON | ON |

SIMULATING MEMORY CELL SENSING FOR TESTING SENSING CIRCUITRY

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

Users of non-volatile memory can program (e.g., write) data to the non-volatile memory and later read that data back. For example, a digital camera may take a photograph and store the photograph in non-volatile memory. Later, a user of the digital camera may view the photograph by having the digital camera read the photograph from the non-volatile memory. Because users often rely on the data they store, it is important to users of non-volatile memory to be able to store data reliably so that it can be read back successfully.

The memory system typically has a memory structure that contains non-volatile memory cells, as well as control circuitry to control memory operations such as erase, program, and read.

BRIEF DESCRIPTION OF THE DRAWINGS

Like-numbered elements refer to common components in the different figures.

FIGS. 5A and 5B depicts threshold voltage distributions.

FIG. 10B depicts a timing diagram of one embodiment of plane to plane data transfer for asynchronous independent plane read.

FIGS. 15A and 15B are table that depict how the NLO transistor is controlled in embodiments in order to selectively discharge SEN.

DETAILED DESCRIPTION

Technology is disclosed herein for testing circuitry that controls memory operations in a memory structure having non-volatile memory cells. The testing of the circuitry can be performed without the memory structure. One embodiment of an apparatus has a semiconductor die having sense blocks and a control circuit. The sense blocks can be connected to a memory structure having non-volatile memory cells. In one embodiment, the memory structure is on one semiconductor die, but the sense blocks and the control circuit are on another semiconductor die. The control circuit is able to perform die level control of memory operations such as program and read in the memory structure. In one embodiment, the control circuit may control the sense blocks to simulate sensing of non-volatile memory cells in a memory structure even though the sense blocks are not connected to a memory structure. The control circuit verifies correct operation of the semiconductor die based on the simulated sensing. For example, the control circuit may verify correct operation of a state machine that controls sense operations at a die level. Thus, the operation of the semiconductor die may be tested without a memory structure.

In some embodiments, the memory structure resides on a memory semiconductor die and the control circuit resides on a control semiconductor die. The control semiconductor die may contain a substantial amount of CMOS circuitry, and hence may be referred to as a CMOS die. These two semiconductor die may be affixed to one other. For example, the two semiconductor die may be bonded to one another. In an embodiment, functionality of the control semiconductor die is tested without the memory semiconductor die. For example, logic on the control semiconductor die that controls sensing of memory cells on the memory semiconductor die can be tested without the memory semiconductor die. This allows the control semiconductor die to be tested early in product development without the need for the memory semiconductor die.

Figure 1:
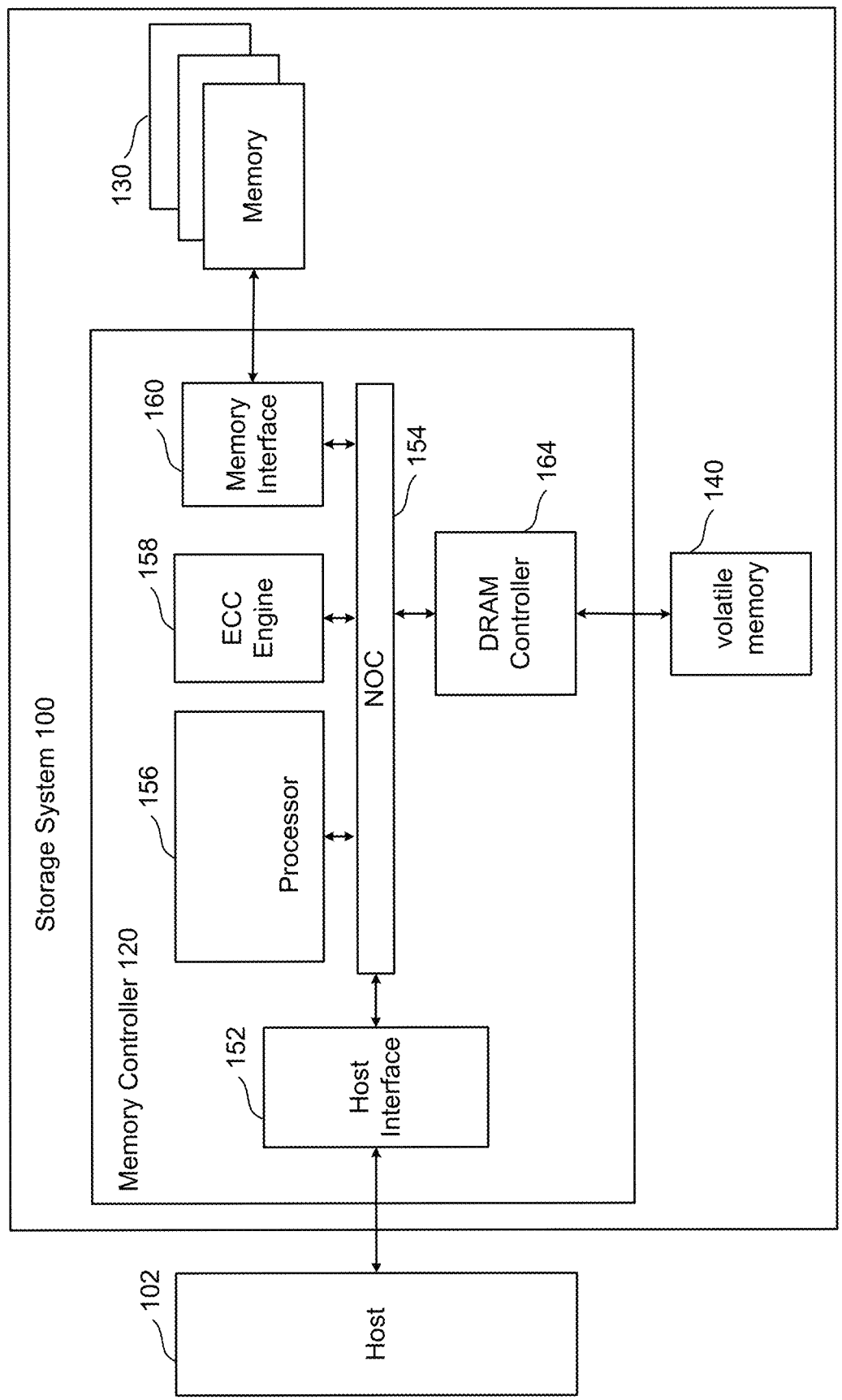
FIG. 1 is a block diagram depicting one embodiment of a storage system.

FIG. 1 is a block diagram of one embodiment of a storage system 100 that may implement the technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM, SRAM). Local high speed volatile memory 140 is used by memory controller 120 to perform certain operations. For example, local high speed volatile memory 140 may store logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
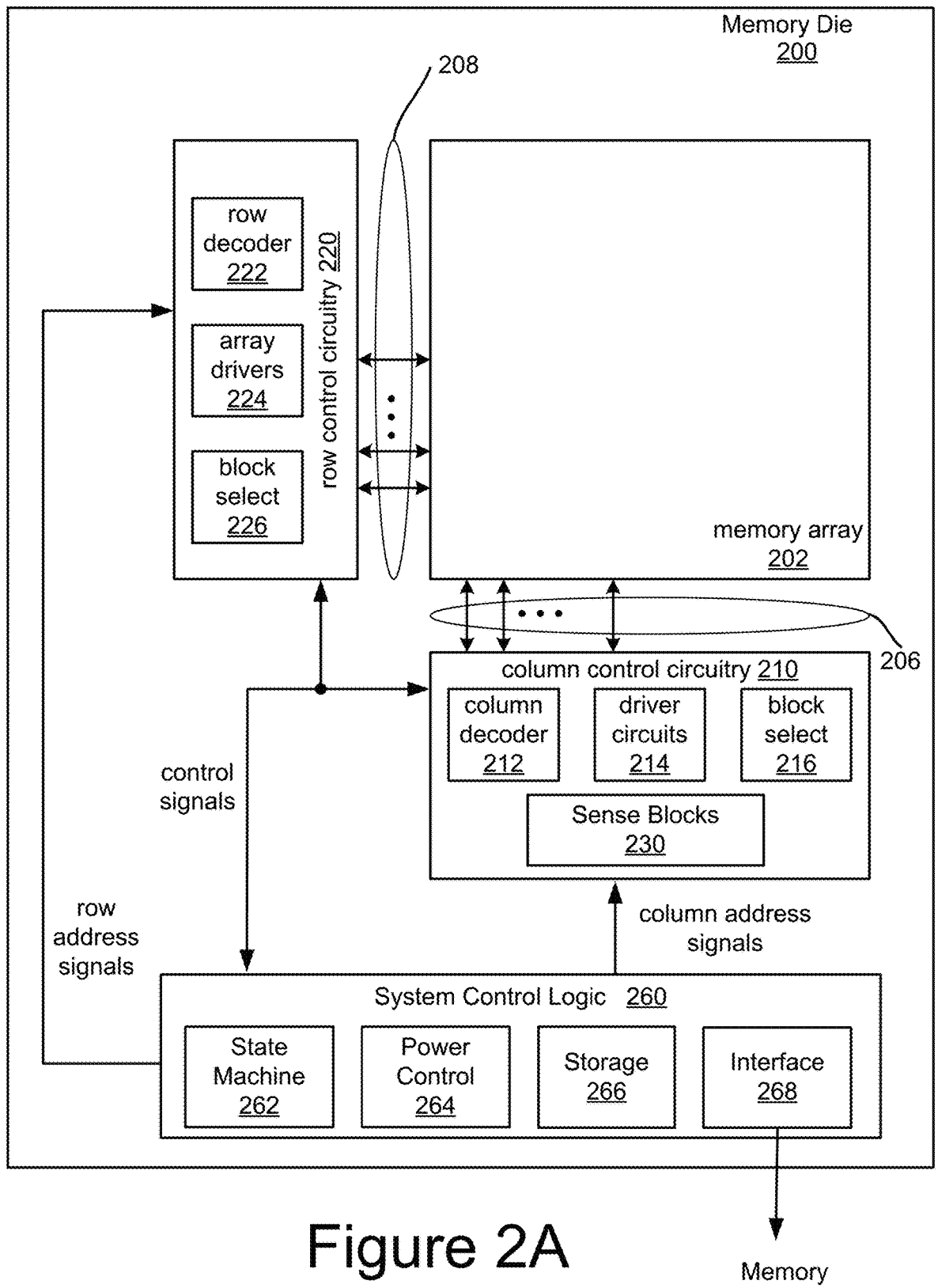
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprise non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including sense blocks(s) 230. The sense blocks contain sense amplifiers and data latches. The sense amplifiers have input/outputs 206 connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In an embodiment, the state machine 262 is implemented by a micro-controller or microprocessor. System control logic 260 can also include a power control module 264 that controls the power and voltages supplied to the rows and columns of the memory structure 202 during memory operations and may include charge pumps and regulator circuit for creating regulating voltages. System control logic 260 includes storage 266 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

The peripheral circuitry controls memory operations in the memory array 202 at a die level. Die level control refers to such actions as applying voltages to the memory structure and direct control of the sense blocks 230 that sense the bit lines. For example, the state machine 262 controls voltage generators (in power control 264) to apply voltages to word lines, bit lines, and control lines in the memory array 202. The state machine 262 issues control signals to control the timing and magnitude of the voltages applied to the memory structure, as well as to control the timing of sensing the memory cells in conjunction with the voltages applied to the memory structure. Die level control is in contrast to the control performed by the memory controller 120 (see FIG. 1), which issues commands (e.g., program, read) to the peripheral circuitry. For example, the memory controller 120 may issue ONFI commands, which does not constitute die level control as the term is used herein.

In some embodiments, functionality of the peripheral circuitry is tested when the peripheral circuitry is not connected to the memory array 202. The state machine 262 may be configured to control sense operations, which sense memory cells in the memory array 202 when the memory array 202 is connected to the peripheral circuitry. In some embodiments, the functionality of the state machine 262 is tested even though the memory array 202 is not connected to the peripheral circuitry. In one embodiment, sensing of the memory cells in the memory array 202 is simulated by manipulating voltages at sense nodes in the sense blocks 230. Then, the functionality of the peripheral circuitry (e.g., functionality of the state machine 262) may be tested based on the simulated sensing. This allows the peripheral circuitry to be tested early in development even though the memory array 202 is not connected to the peripheral circuitry. In some embodiments, all or a portion of peripheral circuitry is formed in a semiconductor substrate below the memory array 202, which may be referred to herein as "circuit under array." In some embodiments, this circuit under array is tested without the presence of the memory array 202.

An area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory structure die) and some or all of the peripheral circuitry elements, including one or more control circuits, can be formed on a separate die (referred to as the control die). For example, a memory structure die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory structure die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die.

Although the following will focus on a bonded memory circuit of one memory structure die and one control die, other embodiments can use more die, such as two memory structure die and one control die, for example.

Figure 2B:
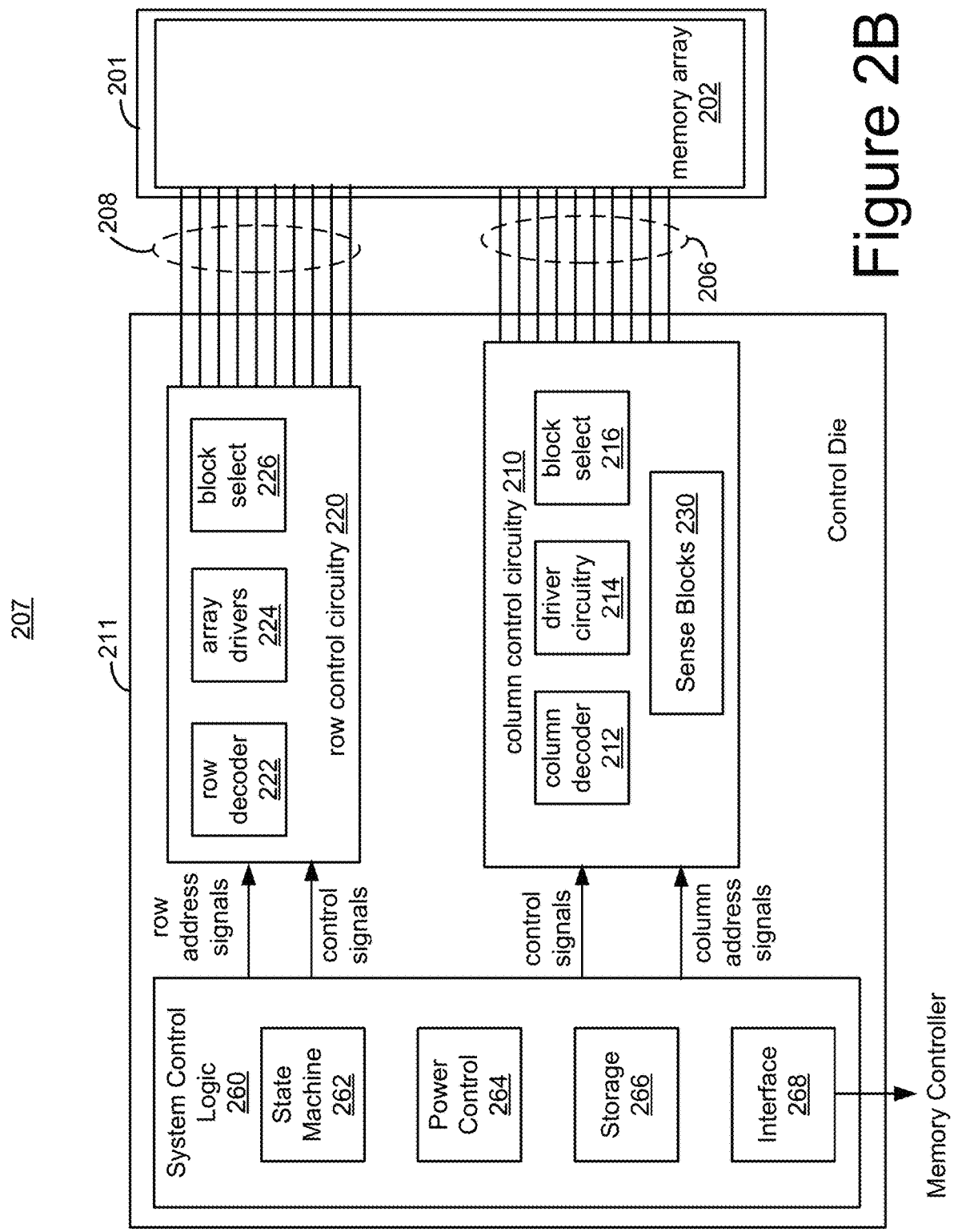
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense blocks(s) 230 on the control die 211 coupled to memory structure 202 on the memory structure die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control 264, all or a portion of system control logic 260, all or a portion of row control circuitry 220, all or a portion of column control circuitry 210, sense blocks 230, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

In some embodiments, functionality of the control die 211 is tested when the control die 211 is not connected to the memory structure die 201. The state machine 262 may be configured to control sense operations, which sense memory cells in the memory structure die 201 when the memory structure die 201 is connected to the control die 211. In some embodiments, the functionality of the state machine 262 is tested even though the memory structure die 201 is not connected. In one embodiment, sensing of the memory cells is simulated by manipulating voltages at sense nodes in the sense blocks 230. Then, the functionality of the control die 211 (e.g., functionality of the state machine 262) may be tested based on the simulated sensing. This allows the control die 211 to be tested early in product development.

Figure 2C:
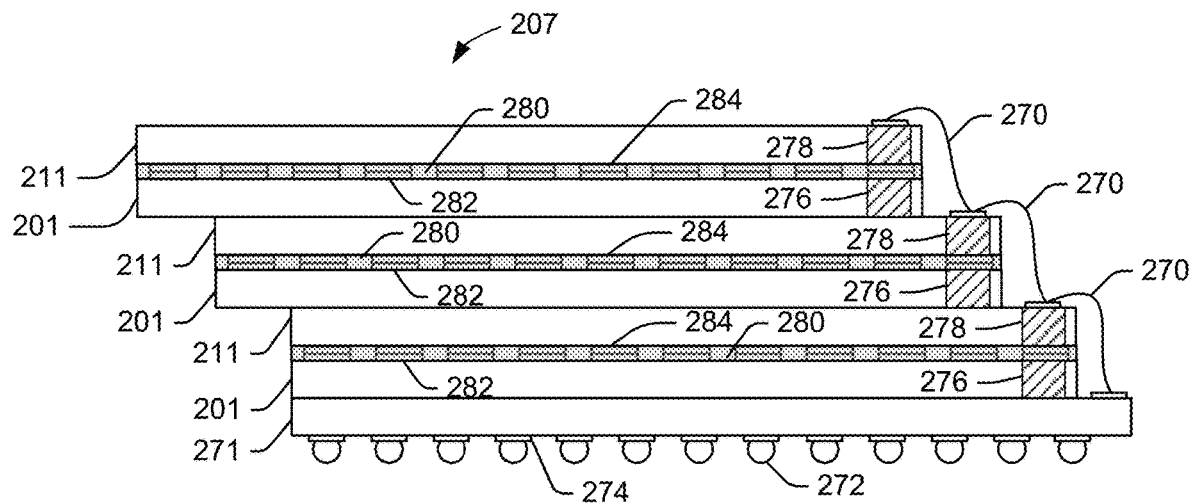
FIGS. 2C and 2D depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control die 211 and multiple memory structure die 201. FIG. 2C depicts a side view of an embodiment of an integrated memory assembly 207 stacked on a substrate 271 (e.g., a stack comprising control die 211 and memory structure die 201). The integrated memory assembly 207 has three control die 211 and three memory structure die 201. In some embodiments, there are more than three memory structure die 201 and more than three control die 211.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 2C).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 2D:
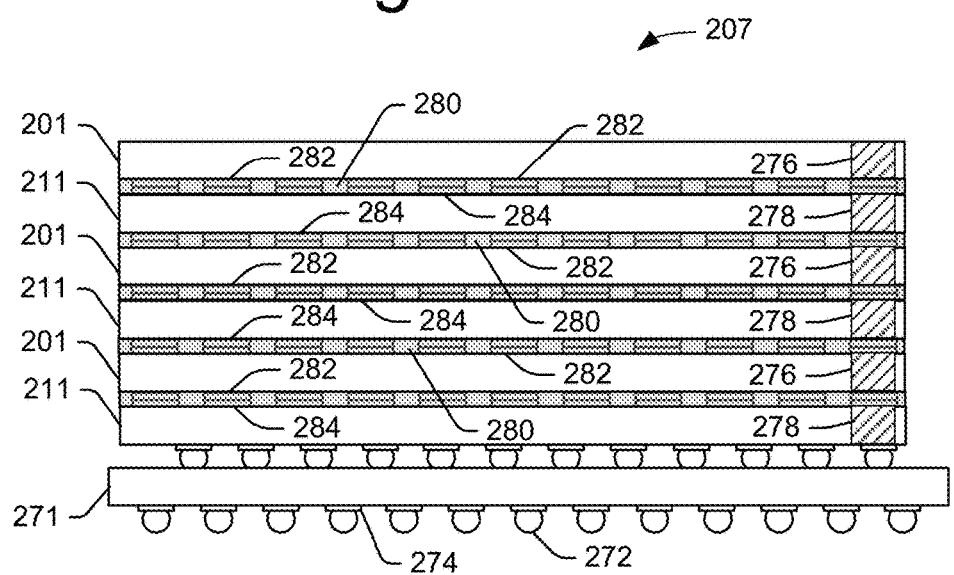

FIG. 2D depicts a side view of another embodiment of an integrated memory assembly 207 stacked on a substrate 271. The integrated memory assembly 207 of FIG. 2D has three control die 211 and three memory structure die 201. In some embodiments, there are many more than three memory dies 201 and many more than three control dies 211. In this example, each control die 211 is bonded to at least one memory structure die 201. Optionally, a control die 211 may be bonded to two or more memory structure die 201.

Some of the bond pads 282, 284 are depicted. There may be many more bond pads. A space between two die 201, 211 that are bonded together is filled with a solid layer 280, which may be formed from epoxy or other resin or polymer. In contrast to the example in FIG. 2C, the integrated memory assembly 207 in FIG. 2D does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 3:
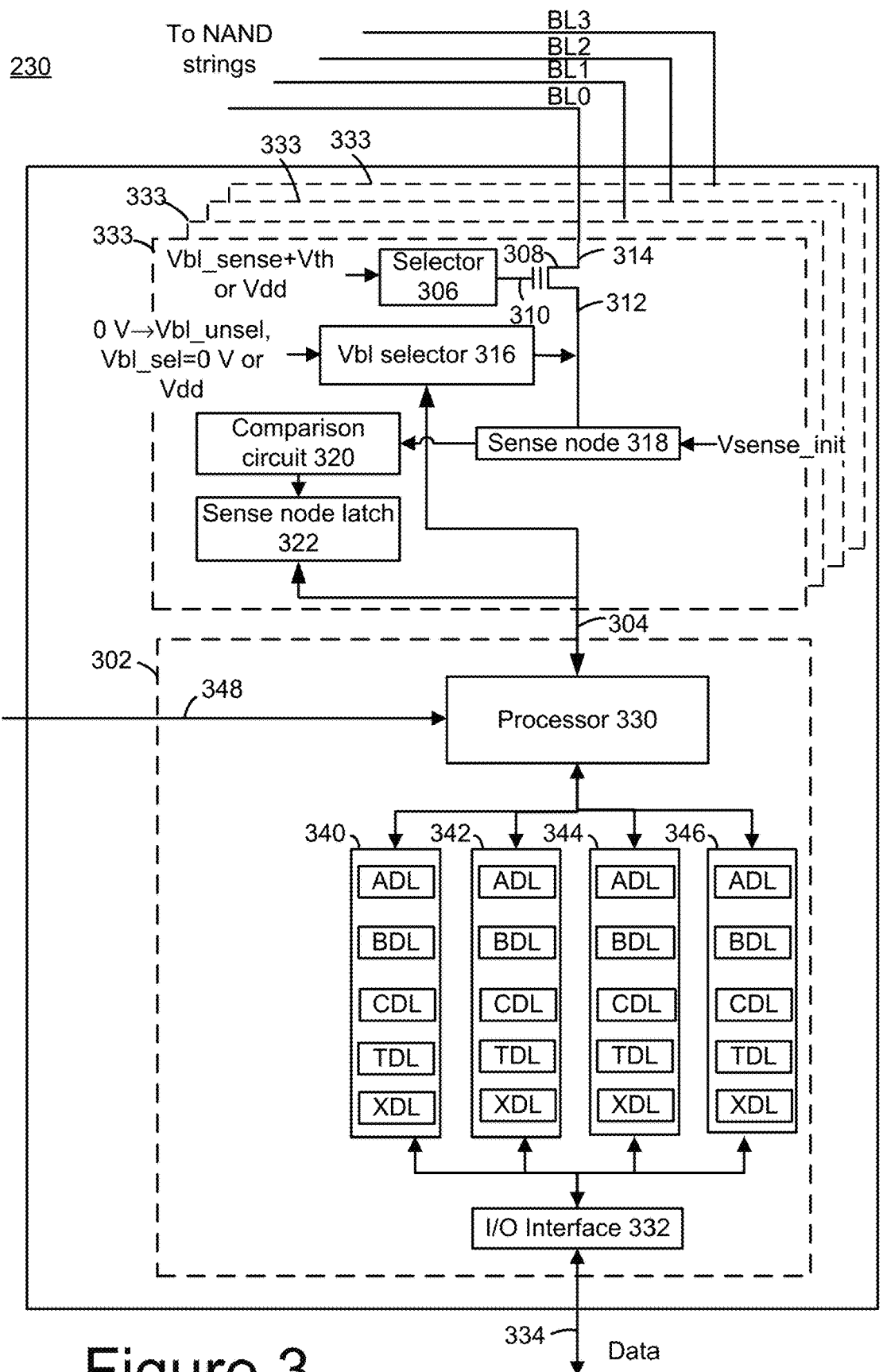
FIG. 3 depicts circuitry used to sense data from non-volatile memory.

FIG. 3 is a block diagram depicting one embodiment of a sense block 230. The sense block 230 is partitioned into a plurality of sense amplifiers 333, and a common portion, referred to as a managing circuit 302. In one embodiment, each sense amplifier 333 is connected to a respective bit line which in turn is connected to one or more NAND strings. Managing circuit 302 is connected to a set of multiple (e.g., four, eight, etc.) sense amplifiers 333. Each of the sense amplifiers 333 in a group communicates with the associated managing circuit via data bus 304.

Each sense amplifier 333 operates to provide voltages to bit lines (see BL0, BL1. BL2. BL3) during program, verify, erase and read operations. Sense amplifiers are also used to sense the condition (e.g., data state) to a memory cells in a NAND string connected to the bit line that connects to the respective sense amplifier.

Each sense amplifier 333 includes a selector 306 or switch connected to a transistor 308 (e.g., an nMOS). Based on voltages at the control gate 310 and drain 312 of the transistor 308, the transistor can operate as a pass gate or as a bit line clamp. When the voltage at the control gate is sufficiently higher than the voltage on the drain, the transistor operates as a pass gate to pass the voltage at the drain to the bit line (BL) at the source 314 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 306 may pass a power supply voltage Vdd, (e.g., 3-4 V) to the control gate of the transistor 308 to cause it to operate as a pass gate.

When the voltage at the control gate is lower than the voltage on the drain, the transistor 308 operates as a source-follower to set or clamp the bit line voltage at Vcg-Vth, where Vcg is the voltage on the control gate 310 and Vth, e.g., 0.7 V, is the threshold voltage of the transistor 308. This assumes the source line is at 0 V. If Vcelsrc is non-zero, the bit line voltage is clamped at Vcg-Vcelsrc-Vth. The transistor is therefore sometimes referred to as a bit line clamp (BLC) transistor, and the voltage Vcg on the control gate 310 is referred to as a bit line clamp voltage, Vblc. This mode can be used during sensing operations such as read and verify operations. The bit line voltage is thus set by the transistor 308 based on the voltage output by the selector 306. For example, the selector 306 may pass Vsense+Vth, e.g., 1.5 V, to the control gate of the transistor 308 to provide Vsense, e.g., 0.8 V, on the bit line. A Vbl selector 316 may pass a relatively high voltage such as Vdd to the drain 312, which is higher than the control gate voltage on the transistor 308, to provide the source-follower mode during sensing operations. Vbl refers to the bit line voltage.

The Vbl selector 316 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 316 can pass a program-enable voltage signal such as 0 V for respective bit lines of selected NAND strings during a program loop.

In one approach, the selector 306 of each sense circuit can be controlled separately from the selectors of other sense circuits. The Vbl selector 316 of each sense circuit can also be controlled separately from the Vbl selectors of other sense circuits.

During sensing, a sense node 318 is charged up to an initial voltage, Vsense_init, such as 3V. The sense node is then connected to the bit line via the transistor 308, and an amount of decay of the voltage on the sense node is used to determine whether a memory cell is in a conductive or non-conductive state. The amount of decay of the voltage on the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state.

In particular, the comparison circuit 320 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. For example, in a program-verify test, a 0 can denote fail and a 1 can denote pass. The bit in the sense node latch can be read out in a state bit scan operation of a scan operation or flipped from 0 to 1 in a fill operation. The bit in the sense node latch 322 can also be used in a lockout scan to decide whether to set a bit line voltage to an inhibit or a program enable level in a next program loop.

Managing circuit 302 comprises a processor 330, four example sets of data latches 340, 342, 344 and 346, and an I/O interface 332 coupled between the sets of data latches and the data bus 334. FIG. 3 shows four example sets of data latches 340, 342, 344 and 346; however, in other embodiments more or fewer than four can be implemented. In one embodiment, there is one set of latches for each sense amplifier 333. One set of five data latches, e.g., comprising individual latches ADL, BDL, CDL, TDL, and XDL, can be provided for each sense circuit. In some cases, a different number of data latches may be used. In a four bit per memory cell embodiment, ADL stores a bit for a lower page of data, BDL stores a bit for a middle page of data, CDL stores a bit for an upper page of data, TDL stores a bit for a top page, and XDL serves as an interface latch for storing/latching data from the memory controller.

Processor 330 performs computations, such as to determine the data stored in the sensed memory cell and store the determined data in the set of data latches. Each set of data latches 340-346 is used to store data bits determined by processor 330 during a read operation, and to store data bits imported from the data bus 334 during a program operation which represent write data meant to be programmed into the memory. I/O interface 332 provides an interface between data latches 340-346 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to processor 330 via the data bus 304. At that point, processor 330 determines the resultant memory state by consideration of the tripping event(s) of the sense circuit and the information about the applied control gate voltage from the state machine via input lines 348. It then computes a binary encoding for the memory state and stores the resultant data bits into data latches 340-346.

Some implementations can include multiple processors 330. In one embodiment, each processor 330 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 330 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 340-346 from the data bus 334. During reprogramming, a respective set of data latches of a memory cell can store data indicating when to enable the memory cell for reprogramming based on the program pulse magnitude.

The program operation, under the control of the state machine 262, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 330 monitors the read back memory state relative to the desired memory state. When the two agree, processor 330 sets the bit line in a program inhibit mode such as by updating its latches. This inhibits the memory cell coupled to the bit line from further programming even if additional program pulses are applied to its control gate.

In some embodiments, the sense block 230 is controlled to simulate sensing of memory cells. This allows testing to be performed when the sense amplifiers 333 are not connected to NAND strings. In one embodiment, the voltage on the sense node 318 is manipulated to simulate sensing of a memory cell even though the sense amplifier 333 is not connected to a memory cell. For example, as described above, during normal sensing the sense node 318 will have either a high voltage or a low voltage after a sense time, depending on whether the memory cell is conducting or not. During an embodiment of simulated sensing the voltage on the sense node 318 is established at either a high voltage or a low voltage after a simulated sense time, depending on whether the memory cell is being simulated as conducting or not. During simulated sensing, the state machine 262 may control timing of the sense amplifier 333 and other circuitry in a similar manner as it does during actual sensing. Hence, circuitry such as the comparison circuit 320, sense node latch 322, and processor 330 operate during an embodiment of simulated sensing in a similar manner as they do during actual sensing.

Figure 4:
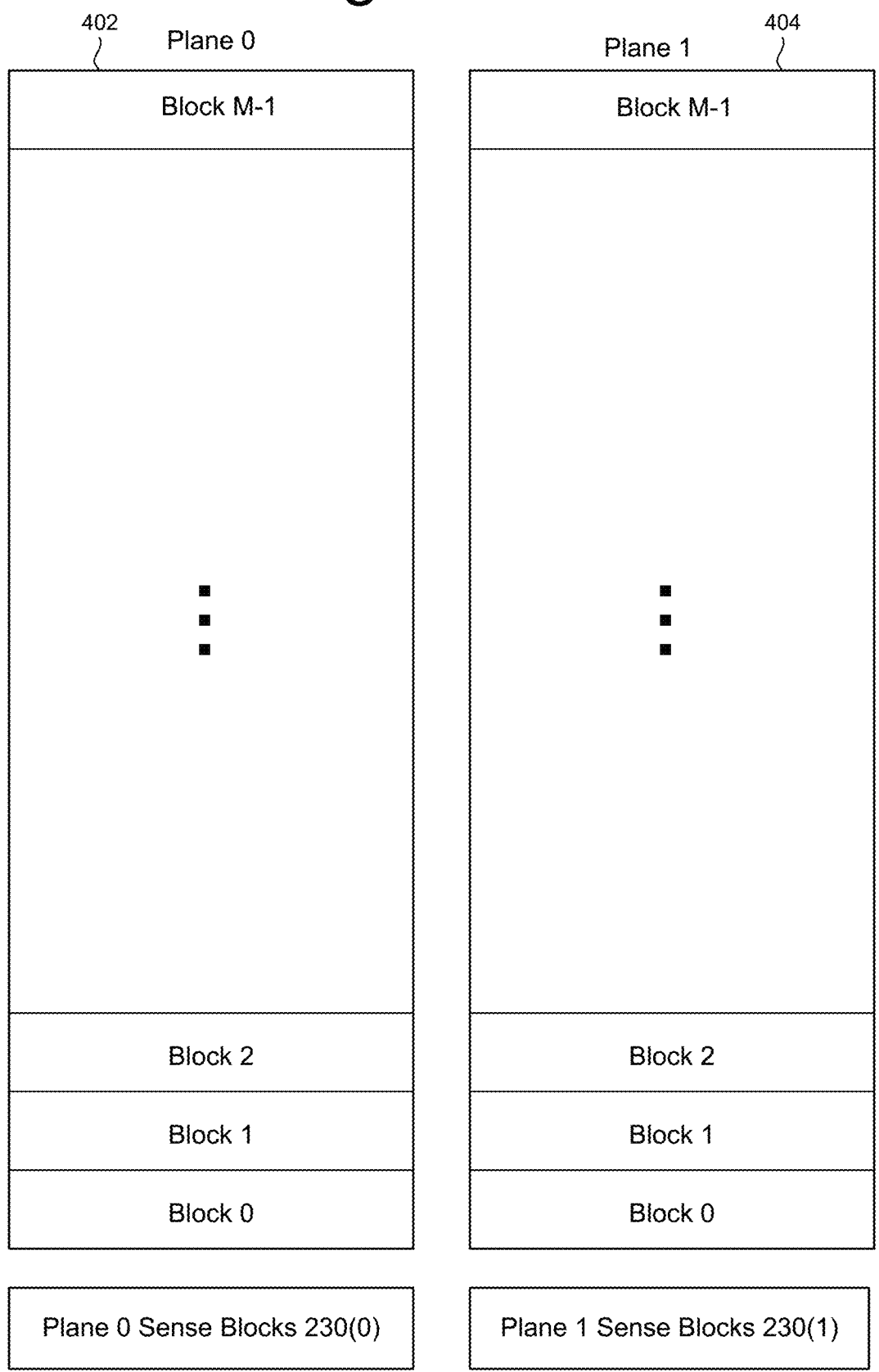
FIG. 4 is a block diagram of one embodiment of a memory structure having two planes.

FIG. 4 is a block diagram explaining one example organization of memory structure 202, which is divided into two planes 402 (Plane 0) and 404 (Plane 1). Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4 shows two planes 402/404, more or fewer than two planes can be implemented. In some embodiments, memory structure 202 includes four planes. In some embodiments, memory structure 202 includes eight planes. In some embodiments, programming can be performed in parallel in a first selected block in plane 402 and a second selected block in plane 404.

In some embodiments, there is a set of sense blocks 230 for each plane. FIG. 4 shows plane 0 sense blocks 230(0) and plane 1 sense blocks 230(1). Sense blocks 230(0) are used for sensing plane 402. Sense blocks 230(1) are used for sensing plane 404. Sense blocks 230(0) may also be used for providing values to bit lines when programming plane 402. Sense blocks 230(1) may also be used for providing values to bit lines when programming plane 404. Thus, each plane can be read or programmed independent of the other planes, which allows for parallel memory operations in the different planes. In some embodiments, sensing of data in memory cells of the planes is simulated such that testing of circuitry that senses memory cells can be performed even though the planes of memory cells are not available.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data.

In the example embodiment of FIG. 5B, each memory cell stores four bits of data. Other embodiments may use other data capacities per memory cell (e.g., such as two, four, or five bits of data per memory cell). FIG. 5B depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Note that in some embodiments, the threshold voltage distributions for a population of memory cells storing four bits of data per memory cell do not overlap and are separated from each other.

Fifteen read reference voltages (Vr1-Vr15) are depicted in FIG. 5B. There may also be verify reference voltages. Each threshold voltage distribution (data state) of FIG. 5B corresponds to predetermined values for the set of data bits. By the threshold voltage of a given memory cell with respect to the various read reference voltages, the system can determine the data state of the memory cell. In some embodiments, the memory cells are read one page at a time. For example, when storing four bits per cell, the memory cells store a lower page, a middle page, an upper page, and a top page. The system reads each page by testing the memory cells at a subset of the read reference voltages. For example, the system might test the memory cells at Vr1, Vr3, Vr6, and Vr11 to read a lower page.

In some embodiments, the system simulates sensing of memory cells even though the memory cells are not present. For example, the system could simulate sensing of a lower page of data. Since the memory structure is not present, the system will not actually apply the various reference voltages to the memory structure. However, the state machine 262 may still issue control signals that control timing of the sensing operation as if a memory structure were present. The system may manipulate sense nodes in accordance with the normal timing of applying the reference voltages in order to simulate sensing.

Figure 6:
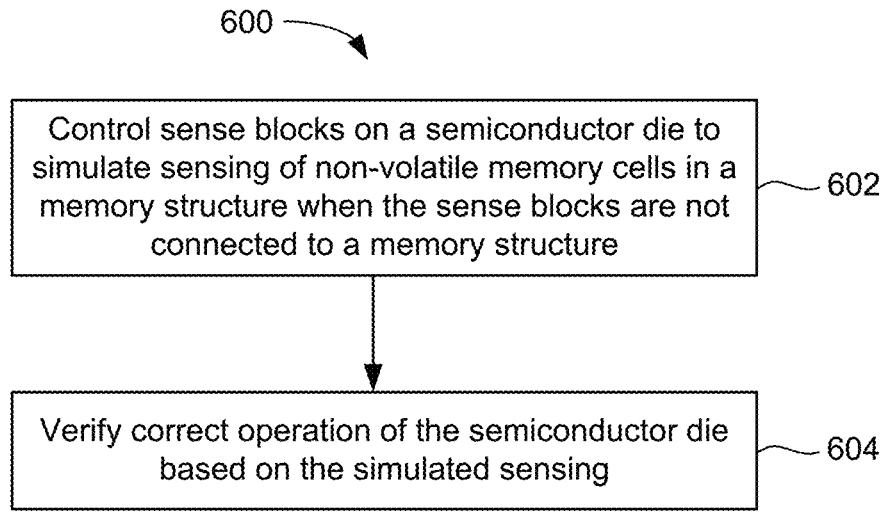
FIG. 6 is a flowchart of one embodiment of a process of testing a semiconductor die that has circuitry for performing memory operations at a die level in a memory structure.

FIG. 6 is a flowchart of one embodiment of a process 600 of testing a semiconductor die that has circuitry for performing memory operations at a die level in a memory structure. As discussed above, die level control refers to the control of the timing and magnitude of voltages applied to the memory structure, as well as the control of the sense blocks that sense the memory cells. In one embodiment, process 600 is used to test some or all of the circuitry on the control die 211. In one embodiment, process 600 is used to test some or all of the peripheral circuitry on the memory die 200. In one embodiments, process 600 is used to test for correct operation of the state machine 262. Process 600 may be performed when the circuitry under test is not connected to the memory structure. This allows the circuitry on the control die 211 and/or the peripheral circuitry on the memory die 200 to be tested without the memory structure that contains the non-volatile memory cells. Process 600 may be performed in response to a command from a controller external to the semiconductor die.

Step 602 includes controlling sense blocks on a semiconductor die to simulate sensing of non-volatile memory cells in a memory structure when the sense blocks are not connected to a memory structure. In one embodiment, step 602 includes manipulating a voltage on sense nodes 318 in the sense blocks 230 to simulate sensing of non-volatile memory cells in a memory structure when the sense blocks are not connected to the memory structure. In one embodiment, step 602 includes transferring a test data pattern from data latches in the sense blocks to sense nodes in sense amplifiers in the sense blocks. In one embodiment, step 602 includes pre-charging sense nodes 318 in the sense amplifiers 333 of a set of sense blocks 230, and selectively discharging the sense nodes to simulate sensing of non-volatile memory cells in the memory structure.

Thus, step 602 may result in the respective sense nodes either having a high voltage or a low voltage, depending on the test data pattern. Step 602 may also include storing a value in the sense node latch 322 (see FIG. 3) to reflect the voltage on the sense node. Note that although this sensing was simulated, other circuitry may treat the value in the sense node latch 322 as if the sense block 230 was connected to a memory structure and actual sensing had been performed. For example, the state machine 262 and the managing circuit 302 may process the value in the sense node latch 322 as though an actual (i.e., not simulated) sense of a memory cell had been performed.

Step 604 includes verifying correct operation of the semiconductor die based on the simulated sensing. Step 604 may include verifying correct function of a sense operation of the semiconductor die based on the established voltages on the sense nodes. In one embodiment, step includes verifying correct function of the sense operation performed by the system control logic 260 based on the manipulated voltages on the sense nodes 318. In one embodiment, step 604 tests for correct operation of the state machine 262. Step 604 may be performed by the circuitry under test and/or the external controller.

Figure 7:
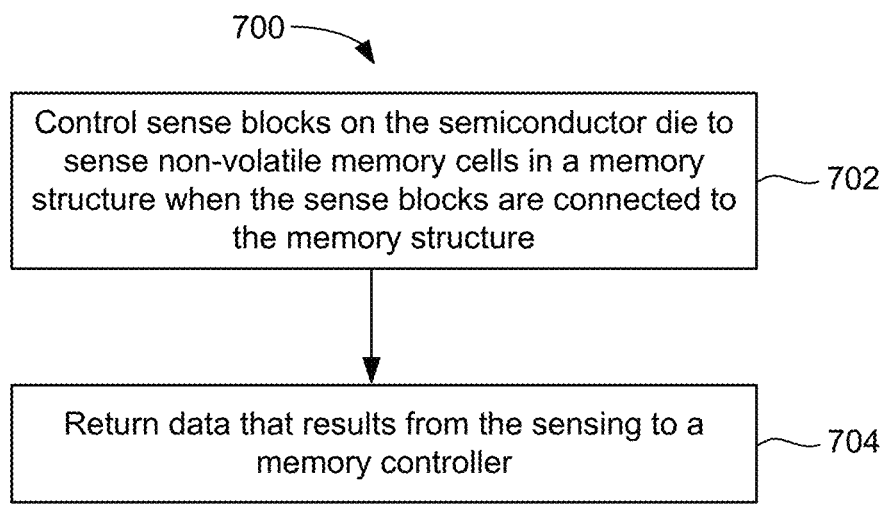
FIG. 7 is a flowchart of a process of one embodiment of controlling a read operation in a memory structure.

FIG. 7 is a flowchart of a process 700 of one embodiment of controlling a read operation in a memory structure. Process 700 may be performed by the circuitry that was tested in process 600, but at a time when the circuitry is connected to a memory structure having the memory cells being read. Process 700 may be performed in response to the memory controller 120 issuing a read command to the semiconductor die (e.g., the control die 211 or the memory die 201).

Step 702 includes controlling sense blocks on the semiconductor die to sense non-volatile memory cells in a memory structure when the sense blocks are connected to the memory structure. The sense blocks 230 are controlled in conjunction with the state machine 262 controlling the voltages applied to the memory structure. Step 702 may include the state machine 262 controlling the timing and magnitude of voltages applied to the memory structure, as well as controlling the sense blocks 230.

Step 704 includes returning data that results from the sensing of step 702 to the memory controller 120.

Note that in step 602 of process 600 the state machine 262 operation may be similar to its operation in step 702 of process 700, which allows process 600 to test for correct operation of the state machine 262. For example, the state machine 262 may treat the simulated sensing in step 602 as if it were actual sensing of a memory structure (such as performed in step 702).

Figure 8:
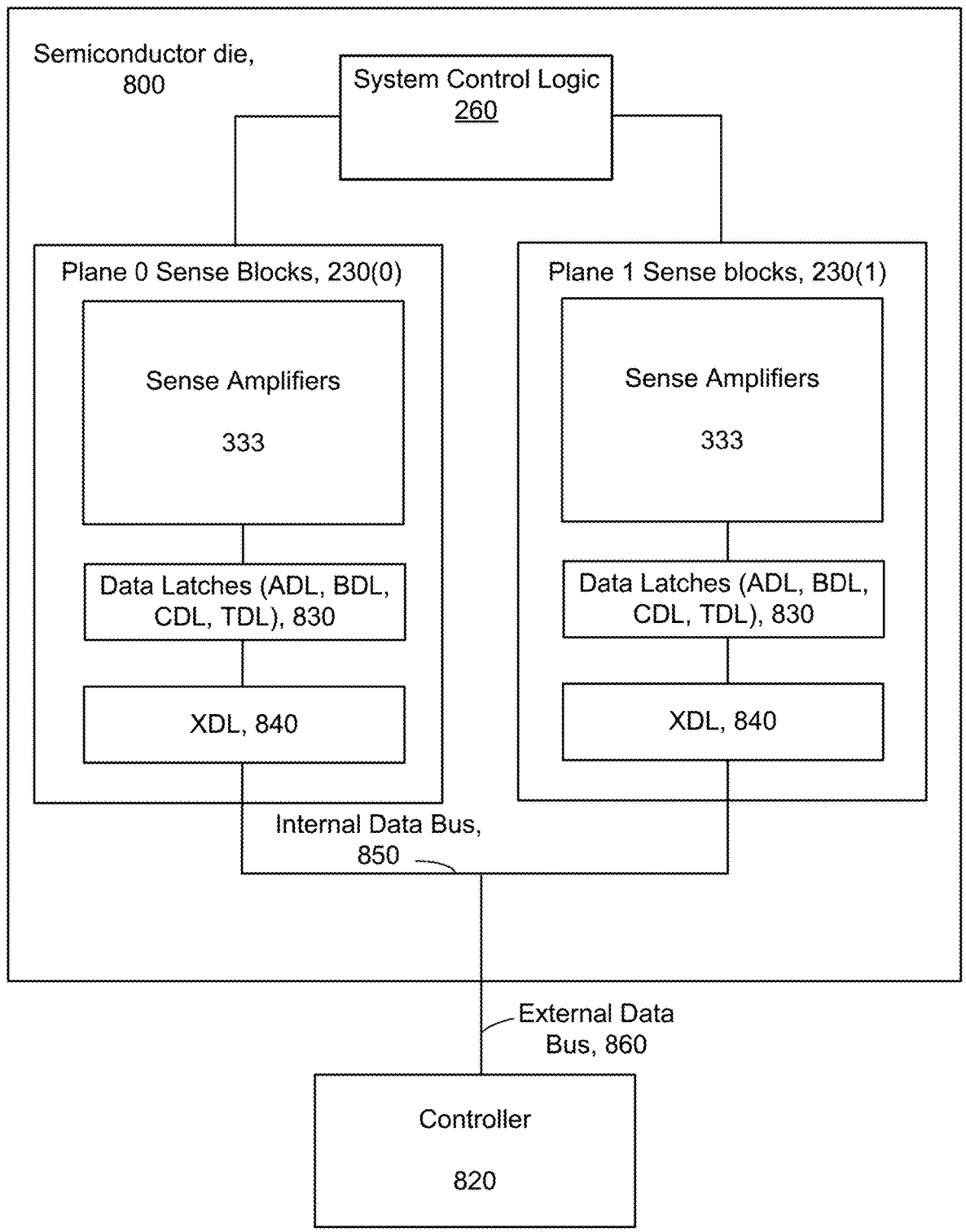
FIG. 8 is a block diagram of a system for testing circuitry that is able to perform on-die control of memory operations in a memory structure.

FIG. 8 is a block diagram of a system for testing circuitry that is able to perform on-die control of memory operations in a memory structure. The system is able to test the circuitry even though the memory structure is not connected to the circuit under test. The memory structure is not depicted in FIG. 8. The system includes a semiconductor die 800 and a controller 820. The semiconductor die 800 could be, but is not limited to, the control die 211 or a portion of the memory die 200 that contains peripheral circuits but does not contain the memory array 202. The semiconductor die 800 has system control logic 260 and sense blocks 230(0) and 230(1), similar to the dies in FIGS. 2A and 2B. Each sense block 230 has sense amplifiers 333, data latches 830 (e.g., ADL, BDL, CDL, TDL) and XDL latches 840, which is consistent with the sense block 230 depicted in FIG. 3. Each set of sense blocks 230(0), 230(1) is associated with a plane. For example, sense blocks 230(0) are associated with Plane 0 and are used to sense memory cells on Plane 0 when the memory structure is connected to the sense blocks. Sense blocks 230(1) are associated with Plane 1 and are used to sense memory cells on Plane 1 when the memory structure is connected to the sense blocks. There may be additional sets of sense blocks for other planes.

The semiconductor die 800 may have other elements such as row control circuitry and additional column control circuitry, but those are not depicted in FIG. 8. The controller 820 and the semiconductor die 800 are connected by an external data bus 860. In one embodiment, the external data bus 860 is an ONFI bus, but the external data bus 860 could be consistent with some other protocol. The external data bus 860 is connected to an internal data bus 850 on the semiconductor die 800. In an embodiment, the internal data bus 850 is connected to the sense blocks 230 for each plane. In particular, the internal data bus 850 may connect to the respective XDL latches 840. Hence, the XDL latches 840 may be used to receive data from the controller 820, or to store data to be provided to the controller 820. In some embodiments, the internal data bus 850 is sub-divided into additional data busses. For example, each plane could have an "XDL bus" connected to the XDL latches 840. Also, each plane could have an "I/O bus" connected between the XDL bus bus and a common bus for all planes. This common bus may be referred to as a "YIO bus."

The controller 820 may be used to initiate testing of the semiconductor die 800 by, for example, sending a test read command. In some embodiments, the controller 820 sends test data to the semiconductor die 800. The controller 820 may be implemented by memory controller 120, but is not limited thereto.

Figure 9:
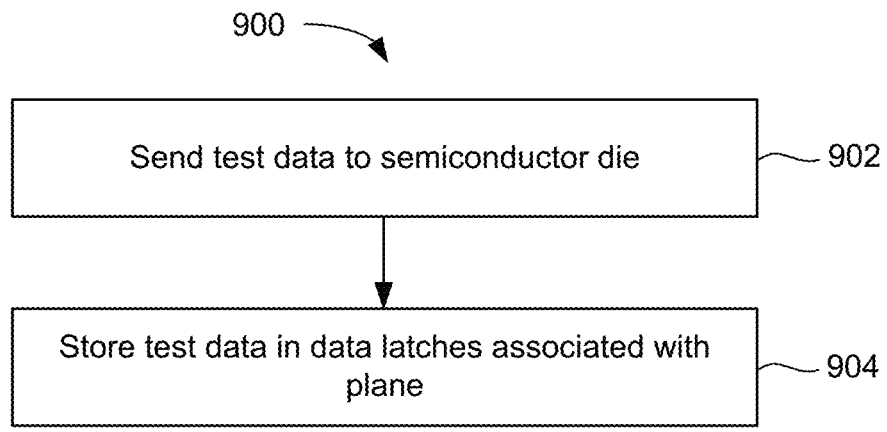
FIG. 9 is a flowchart of one embodiment of a process of providing test data to the semiconductor die under test.

FIG. 9 is a flowchart of one embodiment of a process 900 of providing test data to the semiconductor die under test. FIG. 9 will be described by referring to FIG. 8. Step 902 includes sending test data to the semiconductor die. In one embodiment, controller 820 sends the test data to the semiconductor die 800 by way of the external data bus 860. In some embodiments, the controller 820 specifies a plane, which indicates where the test data should initially be stored. In one embodiment, the test data is initially stored in the XDL latches 840. For the sake of example, the test data is stored in XDL latches 840 in the Plane 1 sense blocks 230(1).

Step 904 includes storing the test data in data latches associated with a plane. With reference to FIG. 8, the test data may be moved from the XDL latches 840 to some of the data latches 830. For example, the test data could be moved from the XDL latches 840 to the ADL latches in the Plane 1 sense blocks 230(1). Alternatively, the test data could be moved from the XDL latches 840 to the BDL latches, CDL latches, or TDL latches. Process 900 may then be repeated to store additional test data to other data latches. In one embodiment, there are four planes per die. The test data is loaded to the ADL, BDL, CDL, and TDL latches on three of the four die. The fourth plane will be tested by simulating sensing, in this example.

Figure 10:
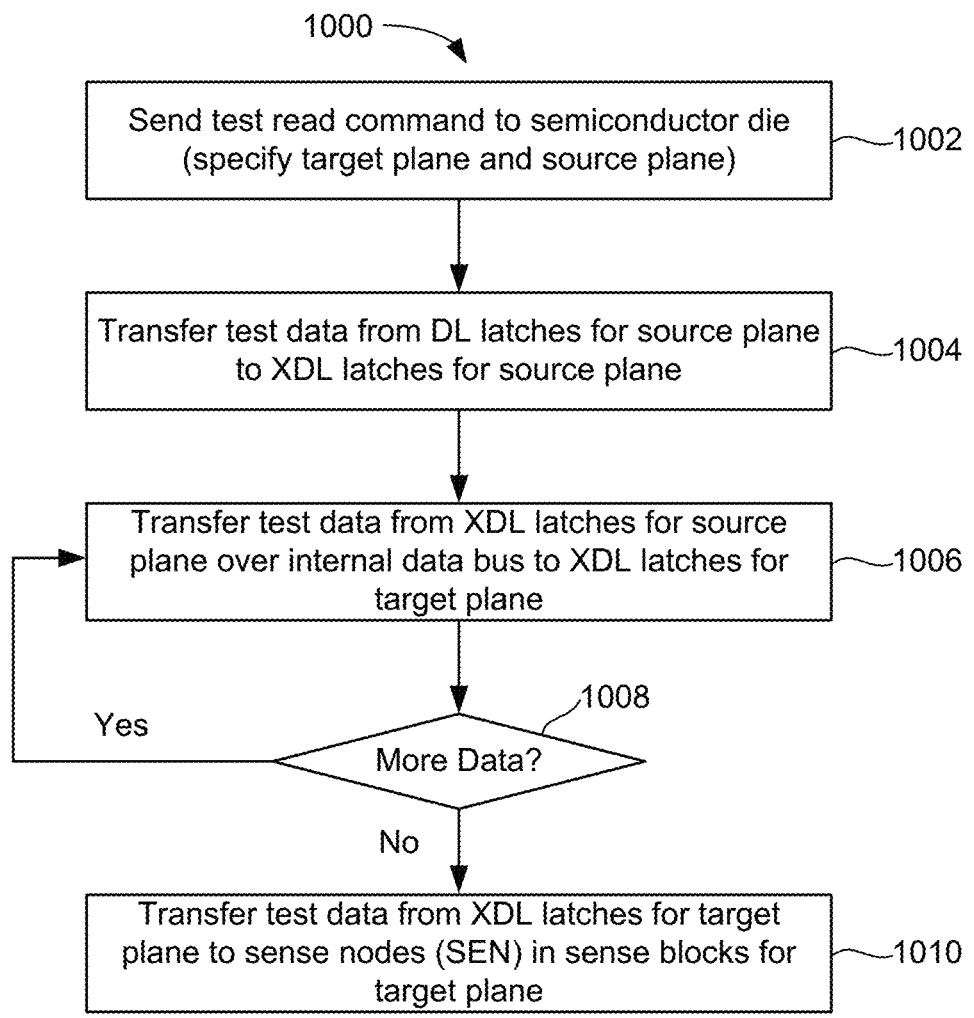
FIG. 10 is a flowchart of one embodiment of a process of transferring test data to sense nodes in sense blocks.

FIG. 10 is a flowchart of one embodiment of a process 1000 of transferring test data to sense nodes in sense blocks. Process 1000 is one technique for simulating sensing of memory cells. Hence, process 1000 may be used in step 602 of process 600. Process 1000 may be performed after storing the test data as described in process 900.

Step 1002 includes sending a test read command to a semiconductor die. The test read command specifies a target plane and a source plane. The source plane indicates the senses blocks 230 that are to provide the test data. The target plane indicates the sense blocks that are to receive the sense data. An example will be described in which the source plane is Plane 1, therefore, the test data is in sense blocks 230(1). In this example, the target plane is Plane 0, therefore, the test data is to end up in sense blocks 230(0).

In an embodiment, the test read command is an extension to a memory interface specification such as the ONFI specification. The following is an example of a test read command: SL_Enable+Pattern #+Read Command. In this example, SL_Enable enables the test read mode. In this example, Pattern # is used to specify the source of the data. In one embodiment, the pattern number contains four bits, which indicate the latch and plane in the four plane/four latch example discussed above. That is, there may be four latches (e.g., ABL, BDL, CDL, TDL) for each of four planes. The Pattern # uniquely specifies one set of latches on one of the planes. There may be more or fewer than four planes, and more of fewer than four sets of latches per plane. Hence, the Pattern # may vary accordingly. The Read Command may be a standard read command that would normally be issued and may specify the target plane. For example, the Read Command could be an ONFI read command, specifying the target plane. The SL_Enable portion of the read test command may be an extension to the memory interface specification. In one embodiment, system control logic 260 issues column address signals to select the source and target planes in response to the read test command.

Step 1004 includes transferring the test data from data latches 830 for the source plane to XDL latches for the source plane. For example, the test data may be transferred from the ADL latches in sense blocks 230(1) to the XDL latches in sense blocks 230(1).

Step 1006 includes transferring the test data from the XDL latches for the source plane to the XDL latches for the target plane. For example, the test data is transferred from the XDL latches in sense blocks 230(1) over the internal data bus 850 and to the XDL latches 840 in sense blocks 230(0). Due to the limited width of the internal data bus 850, this data transfer may occur in many cycles (see steps 1006, 1008). After all data has been transferred, step 1010 is performed.

Step 1010 includes transferring the test data from the XDL latches for the target plane to sense nodes (SEN) in the sense blocks for the target plane. In one embodiment, the voltage on the sense node 318 is set to a high voltage or a low voltage, depending on the value in the XDL latch associated with the sense amplifier 333. Therefore, process 1000 simulates sensing a memory cell even though the sense amplifier 333 is not connected to the memory cell. In an embodiment, process 1000 may be used to store a desired data pattern into the sense amplifiers 333, based on selection of the source plane.

In one embodiment, process 1000 is performed during a program suspend. For example, the command SL_Enable+ Pattern #+Read Command is inserted during program suspend. As described in FIG. 10, the test read command will trigger the data shuffle from the source plane to the target plane.

Figure 10A:
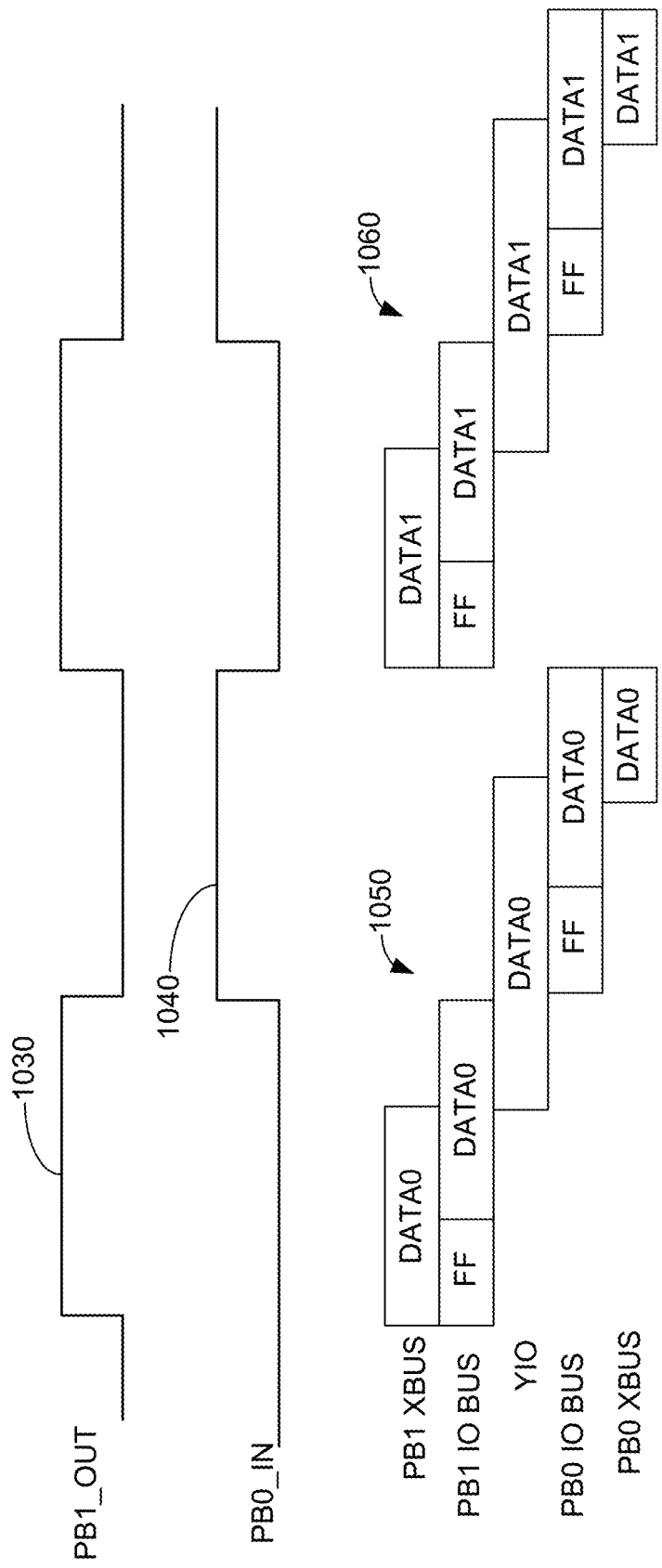
FIG. 10A depicts a timing diagram of one embodiment of plane to plane data transfer.

FIG. 10A depicts a timing diagram of one embodiment plane to plane data transfer. This plane data transfer may occur during an embodiment of process 1000. Timing waveform 1030 shows when plane 1 has control of a YIO bus of the semiconductor die. The YIO bus can be accessed by different planes. However, in an embodiment, only one plane may access the YIO bus at a time. Timing waveform 1040 shows when plane 0 has control of the YIO bus. For example, waveform 1030, 1040, the plane has control of the YIO bus when the signal is high. The data is transferred in units according to the width of the YIO bus. FIG. 10A shows a sequence 1050 for a first data unit (DATA0) and a sequence 1060 for a second data unit (DATA1). There may be many more such sequences to transfer all of the data from one plane to the other plane. Each sequence is divided into transfers on five busses. In this example, each plane has an XDL bus ("XBUS") that is connected to its XDL latches 840. Each plane has an I/O bus ("IO BUS") between its XBUS and the YIO bus that is common to all planes. Thus, the first data unit (DATA0) goes from PB1 XBUS to PB1 IO BUS to the YIO bus during the PB1_OUT phase. During the PB0_IN phase the data transfers from the YIO bus to PB0 IO BUS to PB0 XBUS. This sequence then repeats for other data units.

In some embodiments, sensing of memory cells is simulated during an asynchronous independent plane read (aIPR). For an aIPR the different planes are read independent from one other, in contrast to reading all of the planes in parallel. As one example, plane 2 may be a source plane with plane 0 being the target plane for plane 2. Also, plane 3 may be a source plane, with plane 1 being the target plane for plane 3. Thus, data will be transferred from plane 2 to plane 0, as well as from plane 3 to plane 1. However, the internal data bus 850 may only be used for one transfer at time. Thus, data may be transferred from plane 2 to plane 0, and then data may be transferred from plane 3 to plane 1. However, time can be saved by having some overlap in the transfer process.

FIG. 10B depicts a timing diagram of one embodiment plane to plane data transfer for aIPR. The upper timing chart is for data transfer from plane 2 to plane 0. The lower timing chart is for data transfer from plane 3 to plane 1. The cross-hatches boxes indicate when data is being transferred from one plane to another. The cross-hatched box on the upper timing chart shows when data is being transferred from plane 2 to plane 0. The cross-hatched box on the lower timing chart shows when data is being transferred from plane 3 to plane 1. Also depicted are transfers from the data latches 830 to the XDL latches 840. The first action is a transfer from the data latches 830 in plane 2 to the XDL latches 840 in plane 2 (PB2 DL2X). Also, there is transfer from the data latches 830 in plane 3 to the XDL latches 840 in plane 3 (PB3 DL2X).

Figure 11:
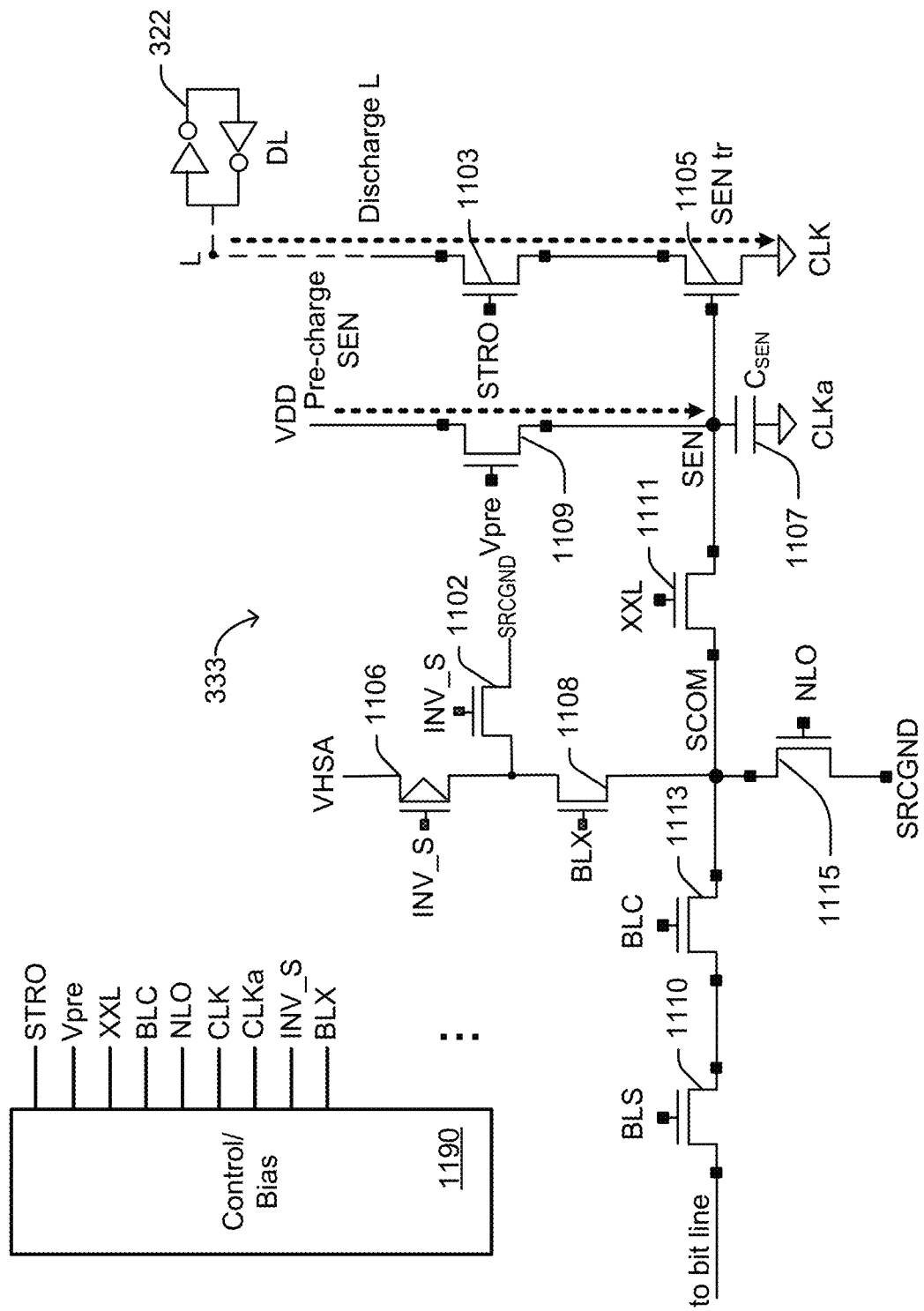
FIG. 11 is a schematic diagram of one embodiment of a sense amplifier.

In another embodiment, sensing a memory cell is simulated by first charging the sense nodes 318 and then selectively discharging the sense nodes. FIG. 11 is a schematic diagram of one embodiment of a sense amplifier 333. First, basic operation of the sense amplifier 333 when sensing a memory cell will be discussed. The voltage level on the SEN node is set by pre-charging SEN to VDD through Vpre 1109, after which it is connected to a selected bit by way of the transistor XXL 1111, transistor BLC 1113, and transistor BLS 1110. The SCOM node between XXL 1111 and BLC 1113 can be set to a value, such as ground or pre-charged to a higher level, by way of transistor NLO 1115 when XXL 1111 and BLC 1113 are off. The current of the bit line will depend on whether the memory cell's Vt is above or below the reference voltage applied to the memory cell. The bit line current may discharge SEN. Thus, if the memory cell is conductive, then SEN is discharged. If the memory cell is not conductive, then SEN is not discharged.

The sense transistor (SEN tr) 1105 is used to test the magnitude of the voltage on SEN. Specifically, a strobe transistor 1103 is turned on by STRO to test the magnitude of the voltage on SEN. The latch 322 represents the sense node latch 322 (see FIG. 3). There may be other latches such as ADL, BDL, CDL, and TDL (see FIG. 3). The value of the latch 322 is determined by the voltage level on the node L, where the node L may be pre-charged to the high VDD level and then, depending on the voltage level on the SEN node, either discharged or not through the transistor SEN tr 1105 to the node CLK during a strobe operation when the transistor STRO 1103 is turned on. As noted, the voltage level on the SEN node is pre-charged to VDD through Vpre 1109, after which it is connected to a selected bit FIG. 11 also schematically represents the control/bias control circuitry 1190 that sets the various levels in FIG. 11, where the same notation (e.g., STRO) is used both for the level and the element to which it is supplied. The Control/Bias circuit 1190 can be implemented in hardware, software, firmware, or combinations of these and the Control/Bias circuit 1190 can be part of one or more of the system control logic 260 of either FIG. 2A or 2 and the sense block of FIG. 3.

To hold charge on the SEN node, a sensing capacitor $C_{sen}$ 1107 is connected to the SEN node, with its lower plate connect to the level CLKa. As illustrated by the broken line arrows, the upper plate of $C_{sen}$ 1107 can be pre-charged by way of the pre-charge transistor Vpre 1109, and then discharged to a selected memory cell along a corresponding bit line by an amount depending on how much current passes through the selected memory cell to set a voltage level on SEN. The level on SEN will then control the amount of current discharged from the node L, and the state latched in DL 322, by way of the sensing transistor SEN tr 1105. Note the SEN is one embodiment of the sense node 318 (see FIG. 3).

FIG. 11 also depicts transistors that may be used to charge the bit line. There are two charging paths for charging the bit line. A first path allows the bit line to be charged to VHSA by a path through transistor 1106, BLX transistor 1108, BLC transistor 1113, and BLS transistor 1108. A second path allows the bit line to be charged to SRCGND by a path through transistor 1102, BLX transistor 1108, BLC transistor 1113, and BLS transistor 1108.

In one embodiment, the voltage on SEN is manipulated to simulate sensing a memory cell even though the sense amplifier 333 is not connected to a bit line (or a memory cell). In one embodiment, SEN is discharged through the NLO transistor 1115 to simulate sensing a memory cell that is conductive. To simulate sensing a memory cell that is not conductive, the NLO transistor 1115 may be kept off such that SEN does not discharge through the NLO transistor 1115.

Figure 12:
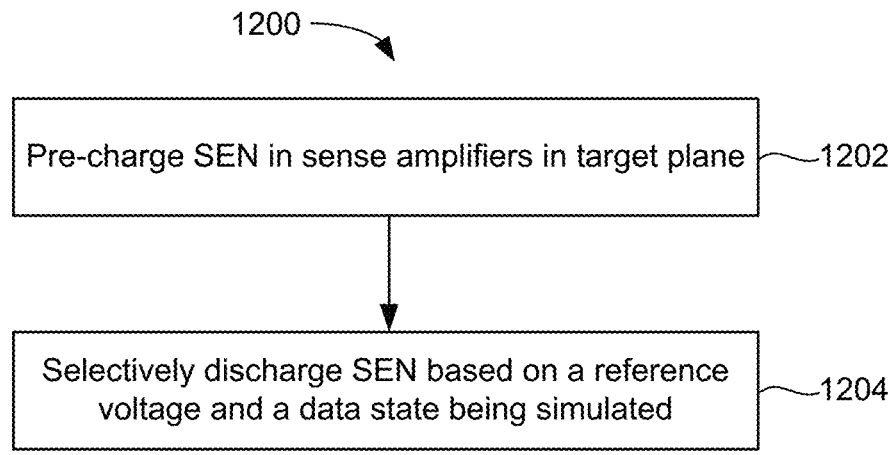
FIG. 12 is a flowchart of one embodiment of a process of simulating sensing of a memory cell.

FIG. 12 is a flowchart of one embodiment of a process 1200 of simulating sensing of a memory cell. Process 1200 may be used in step 602 of process 600. Process 1200 will be discussed with reference to the sense amplifier in FIG. 11, but is not limited thereto. Step 1202 includes pre-charging SEN in the sense amplifiers for a target plane. For example, with respect to FIG. 11, SEN is pre-charged to VDD by activating the Vpre transistor 1109.

Step 1204 includes selectively discharging SEN based on a reference voltage and a data state being simulated. For example, with respect to FIG. 5B, during normal sensing the system will apply one of the read reference voltages at a time to the selected word line. During process 1200, the read reference voltages are not applied to the selected word line, as the memory structure is not present. However, the state machine 262 will still go through a sequence in which control signals for controlling the timing of voltages to the memory structure are generated. Hence, at some point the state machine 262 will generate a control signal for applying, for example, Vr1 to the selected word line. When Vr1 is applied, memory cells being simulated as data state S0 will conduct a current, but memory cells being simulated in any other state will not conduct a current. Hence, the SEN nodes are discharged accordingly. With respect to FIG. 11, SEN is selectively discharged by activating the XXL transistor 1111 and selectively activating the NLO transistor 1115. That is, the NLO transistor 1115 is activated to simulate a conducting memory cell. However, the NLO transistor 1115 is not activated to simulate a non-conducting memory cell. As noted, whether to activate the NLO transistor 1115 will depend on both the state (e.g., S0-S15) being simulated and the reference voltage (e.g., Vr1-Vr15) for which the memory cell's Vt is presently being tested (i.e., simulated testing).

Figure 13:
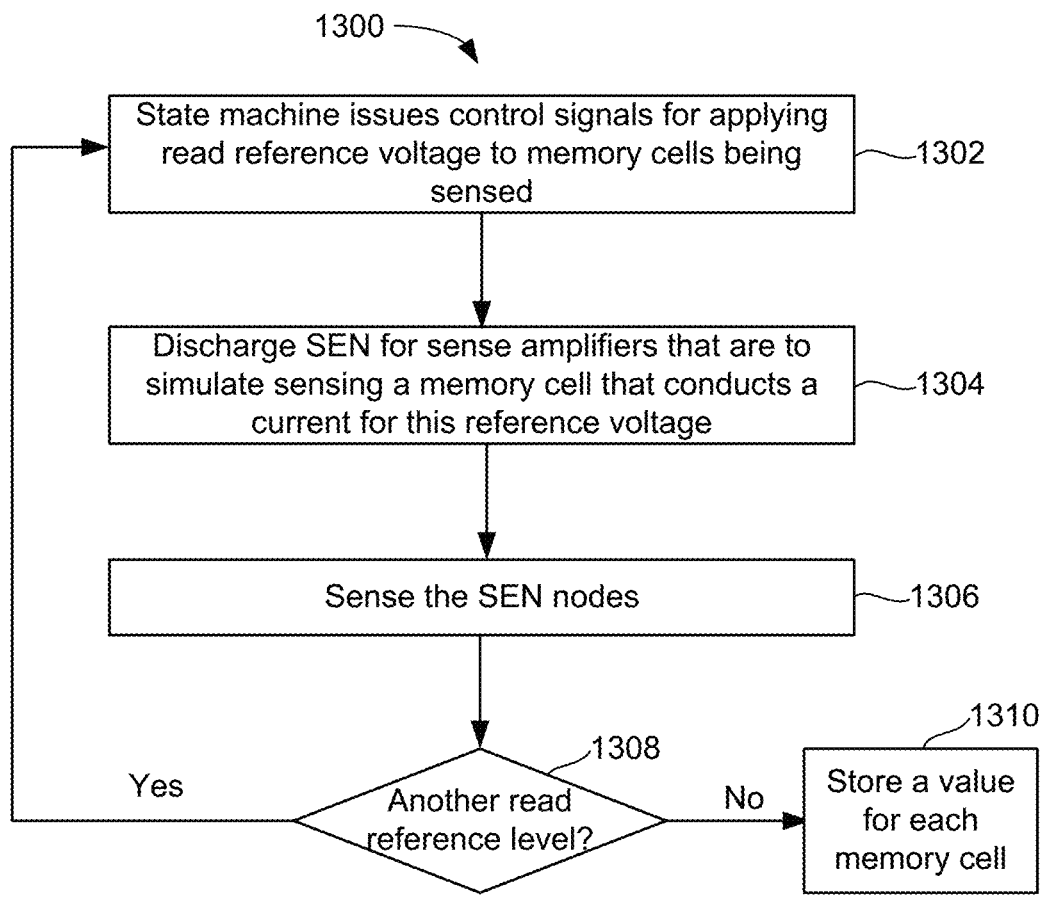
FIG. 13 is a flowchart of one embodiment of a process of simulating sensing of a memory cell.
Figure 14A:
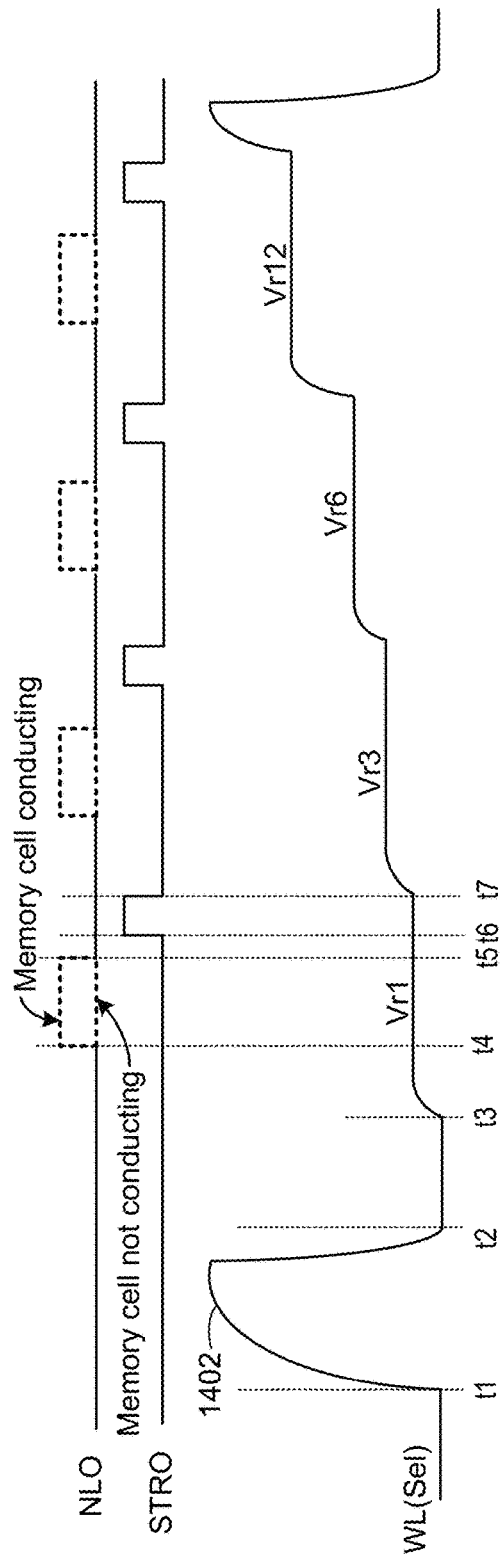
FIG. 14A show timing of a voltage applied to a selected word line during a sense operation such as read or verify.

FIG. 13 is a flowchart of one embodiment of a process 1300 of simulating sensing of a memory cell. Process 1300 may be used in step 602 of process 600. Process 1300 will be discussed with reference to the sense amplifier in FIG. 11, but is not limited thereto. An example of sensing one page of data in sensing that occurs at four different read reference levels will be discussed. Process 1300 will be discussed with reference to FIG. 14A. FIG. 14A show timing of a voltage applied to a selected word line during a sense operation such as read or verify. The sense operation is used to read one page of data. Sensing occurs at four read reference voltages (Vr1, Vr3, Vr6, and Vr12). FIG. 14A indicates that these are applied to the selected word line (WL(Sel)). These correspond to the read reference levels depicted in FIG. 5B. FIG. 14A also shows timing for two of the signals (NLO, STRO) in FIG. 11. However, during simulated sensing the memory structure is not present. Thus, the read reference voltages are not actually applied to the selected word line. However, the state machine 262 still controls the timing of the sense operation, which includes the timing of the read reference voltages in conjunction with the timing of NLO, STRO and other signals. FIG. 14A also shows a read spike voltage 1402 that may be applied to the selected word line between t1 and t2.

Step 1302 includes a state machine 262 issuing control signals for applying a read reference voltage to memory cells being sensed. The state machine 262 issues control signals that, if a memory structure were connected, would apply a read reference voltage to the selected word line. With reference to FIG. 14A, between t3 and t7 Vr1 would be applied to the selected word line if a memory structure were present.

Step 1304 includes discharging SEN for sense amplifiers that are to simulate sensing a memory cell that conducts a current for this reference voltage. With reference to FIG. 14A, this occurs between t4 and t5, where NLO is either high or low depending on whether the memory cell is being simulated as conducting or non-conducting. Note that SEN will be charged prior to t4, although this is not depicted in the timing diagram of FIG. 14A. For memory cells to be simulated as conducting in response to Vr1, NLO is set high in step 1304. This will turn on the NLO transistor 1115 to discharge SEN along the path from SEN through XXL transistor 1111 and through the NLO transistor 1115. However, for memory cells to be simulated as non-conducting in response to Vr1, NLO is set low. This will keep the NLO transistor 1115 off such that SEN cannot discharge through the NLO transistor 1115. Moreover, since the sense amplifier is not connected to a memory cell, SEN cannot discharge through the bit line. Note that the XXL transistor 1111 may be on between t4 and t5 for all sense amplifiers.

Step 1306 includes sensing the sense nodes (SEN). With reference to FIG. 14A, STRO is set high between t6 and t7. Setting STRO high will cause the sense transistor 1105 to sense the state of SEN, wherein a value will be stored in the latch 322. In an embodiment, the processor 330 (see FIG. 3) will sense the latch 322.

Step 1308 includes a determination of whether there is another read reference level to apply. If so, the system repeats steps 1302-1306. With reference to FIG. 14A, there are three more read reference levels to apply (Vr3, Vr6, Vr11). Each of these cases proceeds in a similar manner as discussed with respect to Vr1. Thus, NLO is either high or low depending on whether the memory cell is being simulated as conducting or non-conducting for each respective read reference level. STRO is then set high to sense the SEN node each time a new read reference level is applied. After all read reference levels have been applied a value is stored for each cell in step 1310, depending on the results of sensing at the different read reference levels.

Figure 14B:
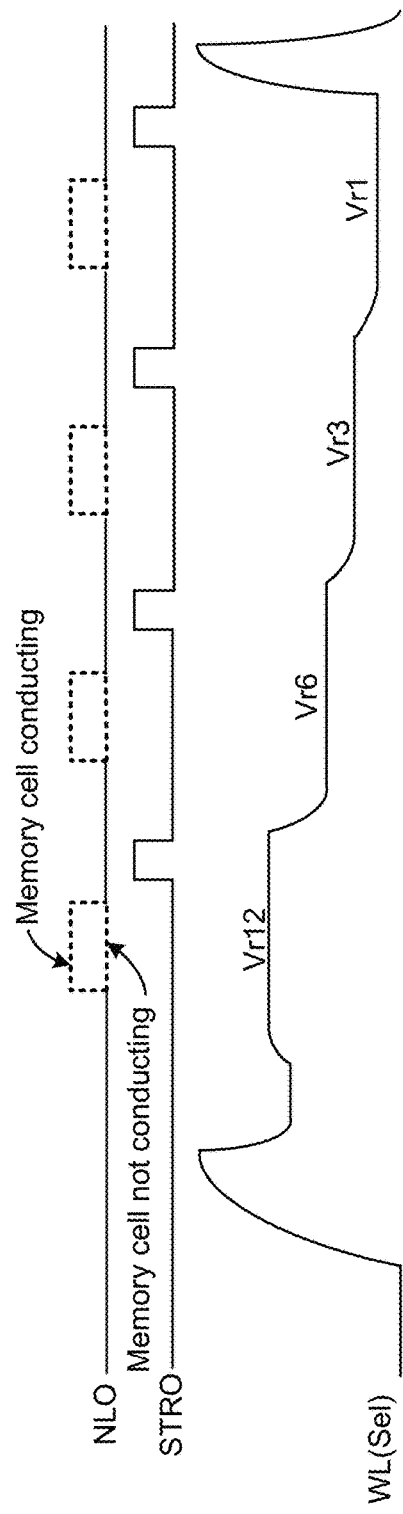
FIG. 14B is a timing diagram of alternative sequence to that in FIG. 14A.

FIG. 14B is a timing diagram of alternative sequence to that in FIG. 14A. In FIG. 14A, the read reference voltages are "applied" from low magnitude to high magnitude. In FIG. 14B, the read reference voltages are applied from high magnitude to low magnitude. Again, the application of the read reference voltages does not actually occur during simulated sensing as the memory structure is not present. However, the state machine 262 will still go through a sequence to control timing of control signals that control circuitry for applying such voltages. FIG. 14B shows one possible timing for NLO and STRO, which can be used in process 1300.

FIG. 15A is a table that depicts how the NLO transistor 1115 is controlled in one embodiment in order to selectively discharge SEN. The table in FIG. 15A corresponds to the example timing diagram in FIG. 14A. The memory cells are simulated as storing 16 possible data states (S0-S15), consistent with the example in FIG. 5B. The table is for sensing one page of data. The page of data is sensed by reading at read reference levels Vr1, Vr3, Vr6, and Vr12. The values in the table show whether the NLO transistor 1115 should be on or off when sensing at the four read reference levels, given the data state being simulated for the memory cell. For example, if a memory cell is being simulated as being in state S1, then NLO should be off when sensing at Vr1 and on when sensing at Vr3, Vr6, and Vr12.

In one embodiment, the sense amplifiers are grouped in units of 16. This group may correspond to a unit of data such as a word. FIG. 15A has a column (SA) for one group of sense amplifiers. In this example, each sense amplifier in the group is assigned a different data state to simulate. For example, sense amplifier SA0 simulates data state S0, sense amplifier SA1 simulates data state S1, sense amplifier SA2 simulates data state S3 etc. This pattern may be repeated for each group of sense amplifiers.

FIG. 15B is a table that depicts how the NLO transistor 1115 is controlled in another embodiment in order to selectively discharge SEN. The table in FIG. 15B corresponds to the example timing in FIG. 14B. The values in the table show whether the NLO transistor 1115 should be on or off when sensing at the four read reference levels, given the data state being simulated for the memory cell. For example, if a memory cell is being simulated as being in state S1, then NLO should be off when sensing at Vr12, Vr6, and Vr3 and off when sensing at Vr1.

In one embodiment, simulated sensing is performed for a lockout read. In another embodiment, simulated sensing is performed for a no lockout read. Note that prior to sensing a memory cell, the bit line may be charged to a target voltage. With reference to FIG. 11, the bit line may be charged by the path through transistor 1106, BLX transistor 1108, BLC transistor 1113, and BLS transistor 1110. Alternatively, the bit line may be charged by the path through transistor 1102, BLX transistor 1108, BLC transistor 1113, and BLS transistor 1110. Charging the bit line requires some power. In a lockout read, power is saved by not pre-charging the bit lines after the state of the memory cell has been determined. However, in lockout read the bit lines will be pre-charged prior to determining the state of the memory cell. In a no lockout read, the bit lines are pre-charged whether or not the state of the memory cell has been determined. For example, with reference to FIG. 14A, for an embodiment of no lockout read, the bit line is pre-charged once for each read reference voltage (Vr1, Vr3, Vr6, Vr12) regardless of the state of the memory cell. If, for example, the memory cell is conducting for the sensing when Vr1 is applied but not conducting for the sensing when Vr3 is applied, then the bit line will not be pre-charged for Vr6 or Vr11 in an embodiment of a lockout read.

In an embodiment of a simulated no-lockout read, the BLX transistor 1108 is kept on during the bit line pre-charge phase, regardless of the state of the memory cell. In an embodiment off a simulated lockout read, the BLX transistor 1108 is on during the bit line pre-charge phase prior to determining the state of the memory cell. However, after determining the state of the memory cell, the BLX transistor 1108 is turned off during the bit line pre-charge phase.

In an embodiment, errors can be injected into the data for the simulated sensing. In an embodiment, bits can be reset to 0 or 1 based on a parameter received from, for example, the controller 820. For example, the controller 820 may send a parameter that indicates that certain bits should be either a 0 or a 1, regardless of the test data pattern. As noted above, in some embodiments the sense amplifiers are grouped into units of, for example, 16 sense amplifiers. Each group may correspond to a unit of I/O data, such as a word or other size unit. The parameter may specify which bits in this unit of I/O data is to be set to 0 or 1. Stated another way, the parameter may specify which sense amplifier in each group of sense amplifiers should have its result set to 0 or 1. Thus, a 1→0 error or a 0→1 error may be simulated.

A first embodiment includes an apparatus, comprising a semiconductor die comprising a plurality of sense blocks and a control circuit in communication with the plurality of sense blocks. The sense blocks are configured to be connected to a memory structure having non-volatile memory cells. The control circuit is configured to control the plurality of sense blocks to simulate sensing of non-volatile memory cells in the memory structure when the sense blocks are not connected to the memory structure. The control circuit is configured to verify correct operation of the semiconductor die based on the simulated sensing.

In a second embodiment, in furtherance to the first embodiment, the control circuit is further configured to control the plurality of sense blocks to sense non-volatile memory cells in the memory structure when the sense blocks are connected to the memory structure. The control circuit is configured to return data that results from sensing the non-volatile memory cells in the first memory structure to a requestor external to the semiconductor die.

In a third embodiment, in furtherance to the first or second embodiments, the control circuit comprises a state machine configured to control sense operations when the plurality of sense blocks are connected to the memory structure. The control circuit is configured to verify correct operation of the state machine based on the simulated sensing.

In a fourth embodiment, in furtherance to any of the first to third embodiments, the control circuit is configured to manipulate a voltage on respective sense nodes in the plurality of sense blocks to simulate sensing of non-volatile memory cells in the memory structure when the sense blocks are not connected to the memory structure, whereby sensing of non-volatile memory cells in the memory structure is simulated. The control circuit is configured to verify correct operation of the semiconductor die based on the manipulated voltages on respective sense nodes.

In a fifth embodiment, in furtherance any of the first to fourth embodiments, the sense blocks contain a plurality of sets of sense blocks. Each set of sense blocks comprises data latches and sense amplifiers. Each set of sense blocks is configured to sense a different plane of memory cells in a memory structure. The control circuit is configured to transfer a test data pattern to data latches of a target set of sense blocks that corresponds to a target plane. The control circuit is configured to transfer the test data pattern from the data latches of the target set of sense blocks to sense nodes in the sense amplifiers of the target set of sense blocks that correspond to the target plane, whereby sensing of non-volatile memory cells in a target plane of a memory structure is simulated.

In a sixth embodiment, in furtherance to any of the fifth embodiment, the control circuit is configured to load the test data pattern into data latches of one or more sets of the sense blocks that correspond to one or more of the planes other than the target plane. The control circuit is configured to transfer the test data pattern from the data latches of one or more sets of the sense blocks that correspond to the other one or more planes to the data latches of the target set of sense blocks that corresponds to the target plane.

In a seventh embodiment, in furtherance to any of the first to sixth embodiments, the sense blocks contain a plurality of sets of sense blocks. Each set of sense blocks comprises data latches and sense amplifiers. Each sense amplifier comprises a sense node. Each set of sense blocks is configured to sense a different plane of memory cells in the memory structure. The control circuit is configured to pre-charge respective sense nodes in the sense amplifiers of a set of the sense blocks that corresponds to a target plane. The control circuit is configured to selectively discharge the respective sense nodes of the set of the sense blocks that corresponds to the target plane to simulate sensing of non-volatile memory cells in the target plane of the memory structure.

In an eighth embodiment, in furtherance to any of the seventh embodiment, the control circuit is configured to issue control signals that are timed to control when reference voltages for sensing non-volatile memory cells are applied to the memory structure. The control circuit is configured to selectively discharge the respective sense nodes of the set of the sense blocks that corresponds to the target plane in accordance with timing of the control signals and a data state being simulated in each respective memory cell.

In a ninth embodiment, in furtherance to any of the first to eighth embodiments, the control circuit is configured to simulate an error in results of the simulated sensing of non-volatile memory cells.

In a tenth embodiment, in furtherance to any of the first to the ninth embodiments, the apparatus further comprises a memory semiconductor die comprising a memory structure having non-volatile memory cells. The semiconductor die is attached to the memory semiconductor die. The sense blocks are connected to the memory structure of the attached memory semiconductor die.

One embodiment includes a method of testing a semiconductor die. The method comprises establishing voltages on sense nodes in sense amplifiers on the semiconductor die when the sense amplifiers are not connected to a memory structure having non-volatile memory cells. The voltages correspond to a data pattern that is simulated as being stored in the non-volatile memory cells. The method comprises verifying correct function of a sense operation of the semiconductor die based on the established voltages on the sense nodes. The method comprises controlling the sense amplifiers to sense non-volatile memory cells in the memory structure when the sense amplifiers are connected to the memory structure The method comprises providing data from sensing the non-volatile memory cells in the memory structure to a requestor external to the semiconductor die.

One embodiment includes a control semiconductor die comprising a plurality of sense amplifiers and system control logic in communication with the plurality of sense amplifiers. Each sense amplifier is configured to be connected to a bit line in a memory structure semiconductor die having a memory structure that comprises bit lines and non-volatile memory cells. Each sense amplifier has a sense node configured to sense a physical condition of a memory cell in the memory structure. The system control logic is configured to control die level memory operations in the memory structure. The system control logic is configured to control a sense operation that senses a physical condition of memory cells when the sense amplifiers are connected to the bit lines of the memory structure semiconductor die. The system control logic is configured to manipulate voltages on the sense nodes to simulate sensing a data pattern stored in memory cells of the memory structure semiconductor die when the sense amplifiers are not connected to the bit lines of the memory structure semiconductor die. The system control logic is configured to verify correct function of the sense operation performed by the system control logic based on the manipulated voltages on the sense nodes.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a semiconductor die comprising a plurality of sense blocks and a control circuit in communication with the plurality of sense blocks, the sense blocks configured to be connected to a memory structure having non-volatile memory cells, wherein the control circuit is configured to:
control the plurality of sense blocks to simulate sensing of non-volatile memory cells in the memory structure when the sense blocks are not connected to the memory structure; and
verify correct operation of the semiconductor die based on the simulated sensing.

2. The apparatus of claim 1, wherein the control circuit is further configured to:
control the plurality of sense blocks to sense non-volatile memory cells in the memory structure when the sense blocks are connected to the memory structure; and return data that results from sensing the non-volatile memory cells in the memory structure to a requestor external to the semiconductor die.

3. The apparatus of claim 1, wherein:
the control circuit comprises a state machine configured to control sense operations when the plurality of sense blocks are connected to the memory structure; and
the control circuit is configured to verify correct operation of the state machine based on the simulated sensing.

4. The apparatus of claim 1, wherein the control circuit is configured to:
manipulate a voltage on respective sense nodes in the plurality of sense blocks to simulate sensing of non-volatile memory cells in the memory structure when the sense blocks are not connected to the memory structure, whereby sensing of non-volatile memory cells in the memory structure is simulated; and
verify correct operation of the semiconductor die based on the manipulated voltages on respective sense nodes.

5. The apparatus of claim 1, wherein:
the sense blocks contain a plurality of sets of sense blocks, each set of sense blocks comprises data latches and sense amplifiers, each set of sense blocks configured to sense a different plane of memory cells in a memory structure; and
the control circuit is configured to:
transfer a test data pattern to data latches of a target set of sense blocks that corresponds to a target plane; and
transfer the test data pattern from the data latches of the target set of sense blocks to sense nodes in the sense amplifiers of the target set of sense blocks that correspond to the target plane, whereby sensing of non-volatile memory cells in a target plane of a memory structure is simulated.

6. The apparatus of claim 5, wherein the control circuit is configured to:
load the test data pattern into data latches of one or more sets of the sense blocks that correspond to one or more of the planes other than the target plane; and
transfer the test data pattern from the data latches of one or more sets of the sense blocks that correspond to the other one or more planes to the data latches of the target set of sense blocks that corresponds to the target plane.

7. The apparatus of claim 1, wherein:
the sense blocks contain a plurality of sets of sense blocks, each set of sense blocks comprises data latches and sense amplifiers, each sense amplifier comprises a sense node, each set of sense blocks is configured to sense a different plane of memory cells in the memory structure; and
the control circuit is configured to:
pre-charge respective sense nodes in the sense amplifiers of a set of the sense blocks that corresponds to a target plane; and
selectively discharge the respective sense nodes of the set of the sense blocks that corresponds to the target plane to simulate sensing of non-volatile memory cells in the target plane of the memory structure.

8. The apparatus of claim 7, wherein the control circuit is configured to:
issue control signals that are timed to control when reference voltages for sensing non-volatile memory cells are applied to the memory structure; and
selectively discharge the respective sense nodes of the set of the sense blocks that corresponds to the target plane in accordance with timing of the control signals and a data state being simulated in each respective memory cell.

9. The apparatus of claim 1, wherein the control circuit is configured to:
simulate an error in results of the simulated sensing of non-volatile memory cells.

10. The apparatus of claim 1, further comprising:
a memory semiconductor die comprising a memory structure having non-volatile memory cells, wherein:
the semiconductor die is attached to the memory semiconductor die; and
the sense blocks are connected to the memory structure of the attached memory semiconductor die.

11. A method of testing a semiconductor die, the method comprising:
establishing voltages on sense nodes in sense amplifiers on the semiconductor die when the sense amplifiers are not connected to a memory structure having non-volatile memory cells, wherein the voltages correspond to a data pattern that is simulated as being stored in the non-volatile memory cells;
verifying correct function of a sense operation of the semiconductor die based on the established voltages on the sense nodes;
controlling the sense amplifiers to sense non-volatile memory cells in the memory structure when the sense amplifiers are connected to the memory structure; and
providing data from sensing the non-volatile memory cells in the memory structure to a requestor external to the semiconductor die.

12. The method of claim 11, wherein verifying correct function of the sense operation of the semiconductor die based on the established voltages on the sense nodes comprises:
verifying correct operation of a state machine on the semiconductor die that controls the sense operation.

13. The method of claim 11, wherein establishing voltages on sense nodes in sense amplifiers on the semiconductor die when the sense amplifiers are not connected to the memory structure having non-volatile memory cells comprises:
transferring the data pattern into a first set of data latches on the semiconductor die; and
transferring the data pattern from the first set of data latches to the sense nodes.

14. The method of claim 13, further comprising:
transferring the data pattern into a second set of data latches on the semiconductor die, wherein the first set of data latches are part of a first set of sense blocks configured to sense a first plane of memory cells in the memory structure, wherein the second set of data latches are part of a second set of sense blocks configured to sense a second plane of memory cells in the memory structure; and
transferring the data pattern into the first set of data latches on the semiconductor die comprises transferring the data pattern from the second set of data latches to the first set of data latches.

15. The method of claim 11, wherein establishing voltages on sense nodes in sense amplifiers on the semiconductor die when the sense amplifiers are not connected to the memory structure having non-volatile memory cells comprises:
pre-charging the sense nodes in the sense amplifiers; and
selectively discharging the sense nodes to simulate sensing the data pattern from the non-volatile memory cells when the sense amplifiers are not connected to the memory structure.

16. A control semiconductor die comprising:
a plurality of sense amplifiers, each sense amplifier configured to be connected to a bit line in a memory structure semiconductor die having a memory structure that comprises bit lines and non-volatile memory cells, each sense amplifier having a sense node configured to sense a physical condition of a memory cell in the memory structure; and
system control logic in communication with the plurality of sense amplifiers, the system control logic configured to control die level memory operations in the memory structure, the system control logic configured to:
control a sense operation that senses a physical condition of memory cells when the sense amplifiers are connected to the bit lines of the memory structure semiconductor die;
manipulate voltages on the sense nodes to simulate sensing a data pattern stored in memory cells of the memory structure semiconductor die when the sense amplifiers are not connected to the bit lines of the memory structure semiconductor die; and
verify correct function of the sense operation performed by the system control logic based on the manipulated voltages on the sense nodes.

17. The control semiconductor die of claim 16, further comprising a plurality of data latches associated with each of the sense amplifiers, wherein the system control logic is configured to:
transfer the data pattern to a set of the data latches associated with the plurality of sense amplifiers; and
transfer the data pattern from the set of the data latches to the sense nodes in the sense amplifiers to simulate sensing the data pattern stored in memory cells of the memory structure semiconductor die when the sense amplifiers are not connected to the bit lines of the memory structure semiconductor die.

18. The control semiconductor die of claim 16, further comprising a plurality of data latches associated with each of the sense amplifiers, wherein the system control logic is configured to:
pre-charge the sense nodes to a sense voltage when the sense amplifiers are not connected to the bit lines of the memory structure semiconductor die; and
selectively discharge the sense nodes to simulate sensing the data pattern stored in memory cells of the memory structure semiconductor die when the sense amplifiers are not connected to the bit lines of the memory structure semiconductor die.

19. The control semiconductor die of claim 18, wherein the system control logic is configured to:
issue control signals that are timed to control when reference voltages are applied to the memory structure when the sense amplifiers are connected to the memory structure semiconductor die;
issue the control signals when the sense amplifiers are not connected to the memory structure semiconductor die; and
selectively discharge the sense nodes of the sense amplifiers in accordance with the timing of the control signals and a data state being simulated in each respective memory cell.

20. The control semiconductor die of claim 16, wherein the system control logic controlling die level memory operations comprises:
applying reference voltages to a selected word line in the memory structure; and
controlling the sense amplifiers in conjunction with the reference voltages to sense memory cells in the memory structure.

\* \* \* \* \*